United States Patent
Takagi et al.

(10) Patent No.: US 9,336,880 B2
(45) Date of Patent: May 10, 2016

(54) NONVOLATILE MEMORY DEVICE AND METHOD OF CONTROLLING THE SAME

(71) Applicant: Kabushiki Kaisha Toshiba, Minato-ku (JP)

(72) Inventors: Takeshi Takagi, Yokkaichi (JP); Masaki Yamato, Yokkaichi (JP); Hiroyuki Ode, Yokkaichi (JP); Takeshi Yamaguchi, Yokkaichi (JP); Toshiharu Tanaka, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/635,448

(22) Filed: Mar. 2, 2015

(65) Prior Publication Data
US 2016/0019959 A1    Jan. 21, 2016

Related U.S. Application Data

(60) Provisional application No. 62/025,037, filed on Jul. 16, 2014.

(51) Int. Cl.
G11C 13/00 (2006.01)
G06F 11/07 (2006.01)

(52) U.S. Cl.
CPC .......... *G11C 13/0069* (2013.01); *G06F 11/073* (2013.01); *G06F 11/076* (2013.01); *G06F 11/0793* (2013.01); *G11C 13/0064* (2013.01); *G11C 13/0097* (2013.01)

(58) Field of Classification Search
CPC ........... G11C 13/0069; G11C 13/0064; G11C 13/0097; G06F 11/073; G06F 11/076; G06F 11/0793
See application file for complete search history.

(56) References Cited

U.S. PATENT DOCUMENTS

| | | | |
|---|---|---|---|
| 7,609,544 B2 | 10/2009 | Osada et al. | |
| 8,300,444 B2 | 10/2012 | Nagashima et al. | |
| 2006/0126380 A1* | 6/2006 | Osada | G11C 11/5678 365/163 |
| 2009/0285024 A1* | 11/2009 | Kang | G11C 11/5628 365/185.03 |
| 2011/0007553 A1* | 1/2011 | Takagi | G11C 13/0007 365/148 |
| 2013/0044534 A1* | 2/2013 | Kawai | G11C 13/0007 365/148 |
| 2013/0208529 A1* | 8/2013 | Tomotani | G11C 29/76 365/148 |
| 2013/0223131 A1 | 8/2013 | Takagi et al. | |
| 2013/0286714 A1 | 10/2013 | Takagi et al. | |

FOREIGN PATENT DOCUMENTS

| | | |
|---|---|---|
| JP | 2006-155700 | 6/2006 |
| JP | 2009-99199 | 5/2009 |

* cited by examiner

*Primary Examiner* — Khamdan Alrobaie
(74) *Attorney, Agent, or Firm* — Oblon, McClelland, Maier & Neustadt, L.L.P

(57) ABSTRACT

A nonvolatile memory device comprises a memory cell comprising a variable resistance element connected between a couple of wirings and a control circuit applying a voltage between the couple of wirings connected to the memory cell. In data rewriting, the control circuit repeats a first voltage application step of applying a first write voltage between the couple of wirings and a first verify step of applying a first voltage lower than the first write voltage between the couple of wirings and comparing a cell current through the cell with a first threshold current, the steps repeated until a magnitude relation of the cell current and the first threshold current satisfies a first condition. If the first condition is satisfied, the circuit performs a second voltage application step of applying a second write voltage between the couple of wirings.

20 Claims, 18 Drawing Sheets

OXYGEN DEFECT DENSITY Φ
: LOW, NUMBER OF Vo: SMALL

OXYGEN DEFECT DENSITY Φ
: HIGH, NUMBER OF Vo: LARGE

NONVOLATILE MEMORY DEVICE AND METHOD OF CONTROLLING THE SAME

CROSS-REFERENCE TO RELATED APPLICATIONS

This application is based upon and claims the benefit of U.S. Provisional Patent Application No. 62/025,037, filed on Jul. 16, 2014, the entire contents of which are incorporated herein by reference.

BACKGROUND

1. Field

The embodiments described herein relate to a nonvolatile memory device and a method of controlling the same.

2. Description of the Related Art

Recently, a Resistive RAM (ReRAM) is proposed that uses, as a memory, a variable resistance element that reversibly changes the resistance. In nonvolatile memory devices, the memory capacity and the integration density are being increased.

DETAILED DESCRIPTION

Figure 1:
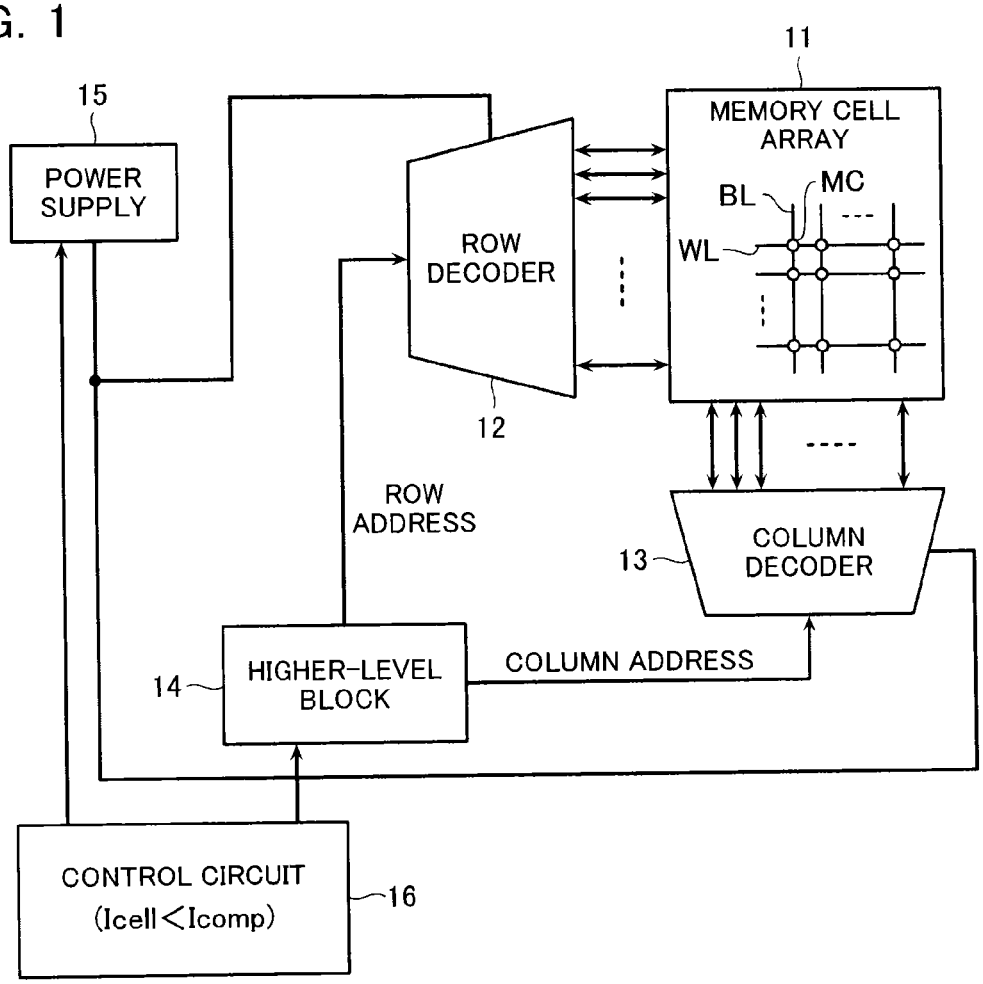
FIG. 1 is an example of a block diagram of a nonvolatile memory device according to a first embodiment.

A nonvolatile memory device according to one embodiment comprises a memory cell comprising a variable resistance element connected between a couple of wirings and a control circuit applying a voltage between the couple of wirings connected to the memory cell. In data rewriting, the control circuit repeats a first voltage application step of applying a first write voltage between the couple of wirings connected to the memory cell and a first verify step of applying a first voltage lower than the first write voltage between the couple of wirings connected to the memory cell and comparing a cell current flowing through the memory cell with a first threshold current, the steps being repeated until a magnitude relation of the cell current and the first threshold current satisfies a first condition. If the first condition is satisfied, the control circuit performs a second voltage application step of applying a second write voltage higher than the first write voltage between the couple of wirings connected to the memory cell.

Referring now to the drawings, the embodiments of nonvolatile memory devices and methods of controlling the same will be described.

First Embodiment

Configuration

First, the entire configuration of a nonvolatile memory device according to a first embodiment will be described. FIG. 1 is an example block diagram of the nonvolatile memory device according to the first embodiment. As shown in FIG. 1, the nonvolatile memory device comprises a memory cell array 11, a row decoder 12, a column decoder 13, a higher-level block 14, a power supply 15 and a control circuit 16.

The memory cell array 11 comprises a plurality of word-lines WL and bit-lines BL, the word-lines WL and bit-lines BL crossing each other and memory cells MC disposed at the intersections thereof. The row decoder 12 selects a word-line WL in an access (write/read) operation. The column decoder 13 selects a bit-line BL in the access operation and comprises a driver to control the access operation.

The higher-level block 14 selects a memory cell MC to be accessed in the memory cell array 11. The higher-level block 14 provides a row address and a column address to the row decoder 12 and the column decoder 13, respectively. The power supply 15 generates a combination of predetermined voltages corresponding to the respective operations of data erase/write/read and supplies it to the row decoder 12 and the column decoder 13.

The control circuit 16 controls operations such as sending an address to the higher-level block 14 and controls the power supply 15 according to an external command. In addition, in writing operations such as a set operation or a reset operation, the control circuit 16 controls the voltage values or the like so that the current flowing through a memory cell MC (hereinafter referred to as the "cell current") Icell is lower than the compliance current Icomp. Note that the control circuit 16 may comprise a device such as an ECC circuit for performing error detection/correction of data read from the memory cell array 11. In other words, the ECC circuit detects bit errors of data read from memory cells MC. Furthermore, at least one of the control circuit and the ECC circuit counts an amount of the bit error detected by the ECC circuit.

[Memory Cell and Memory Cell Array]

Figure 2:
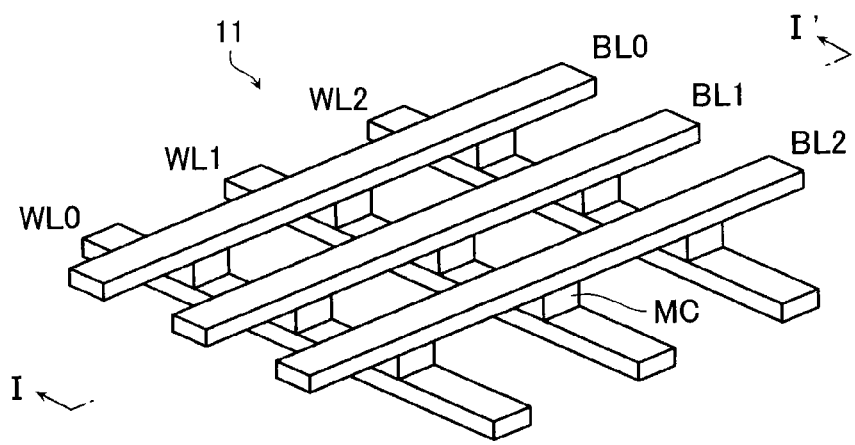
FIG. 2 is a perspective view of a portion of a memory cell array 11 of the semiconductor memory device according to the first embodiment.
Figure 3:
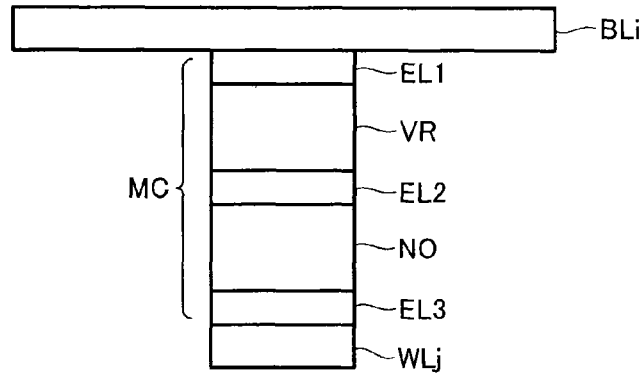
FIG. 3 is a cross-sectional view of one memory cell cut along the I-I' line in FIG. 2 and viewed in the arrow direction.

FIG. 2 is a perspective view of a portion of the memory cell array 11. FIG. 3 is a cross-sectional view of one memory cell cut along the I-I' line in FIG. 2 and viewed in the arrow direction.

As a plurality of first wiring lines, word-lines WL0 to WL2 are provided in parallel. As a plurality of second wiring lines crossing the first wiring lines, bit-lines BL0 to BL2 are provided in parallel. At each of the intersections of them, a memory cell MC is disposed, the memory cell MC being sandwiched between these wiring lines. Preferably, the word-lines WL and the bit-lines BL comprise a material that is heat resistant and has low resistance.

As shown in FIG. 3, each memory cell MC is a bipolar memory cell comprising a series-connected circuit of a variable resistance element VR and a non-ohmic device NO. The variable resistance element VR stores the resistance in a non-volatile manner as rewritable data. In addition, the non-ohmic device NO is a non-ohmic device such as a diode or a transistor. In addition, a bit-line BL, the variable resistance element VR, the non-ohmic device NO and a word-line WL are connected by electrodes EL1, EL2 and EL3 provided therebetween. Each of the electrodes EL1, EL2 and EL3 functions as a barrier metal and a bonding layer. Note that the variable resistance element VR may separately have other layers inserted therein such as a buffer layer, a barrier metal layer and a bonding layer. In addition, the memory cell MC may be a unipolar type.

[Variable Resistance Element VR]

Figure 4:
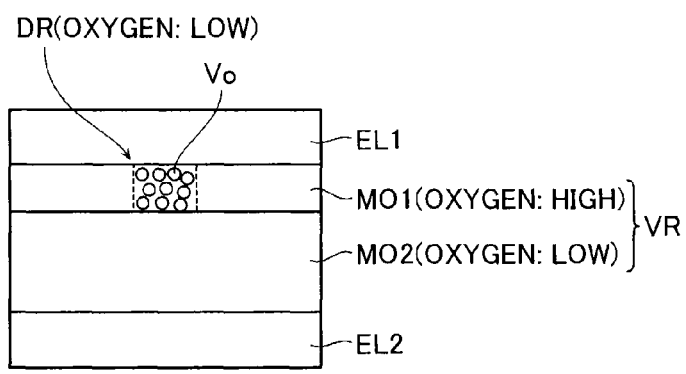
FIG. 4 is a schematic cross-sectional view of a variable resistance element VR.

Next, with reference to FIG. 4, an example configuration of the variable resistance element VR will be described. FIG. 4 is a schematic cross-sectional view showing the example configuration of the variable resistance element VR. As shown in FIG. 4, the variable resistance element VR according to this embodiment comprises a stack of a first metal oxide layer MO1 and a second metal oxide layer MO2. The first metal oxide layer MO1 and the second metal oxide layer MO2 both comprise metal oxide. The first metal oxide layer MO1 contains more oxygen than the second metal oxide layer MO2. Therefore, the resistivity of the first metal oxide layer MO1 is basically higher than the resistivity of the second metal oxide layer MO2.

In addition, as shown in FIG. 4, the first metal oxide layer MO1 has a defect region DR formed therein that contains less oxygen and has a lower resistance. The defect region DR contains a plurality of oxygen defects Vo.

Note that although the variable resistance element VR according to this embodiment comprises a stack of the first and second metal oxide layers MO1 and MO2, the variable resistance element VR may only comprise a metal oxide and may comprise other configurations.

Figure 5A:
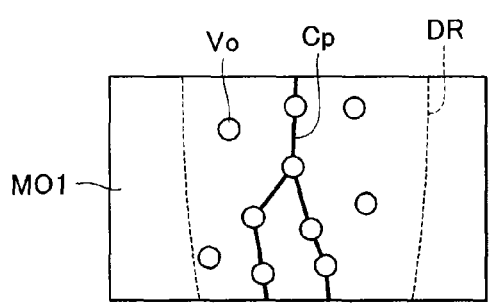
FIG. 5A and FIG. 5B are schematic cross-sectional views of the variable resistance element VR.
Figure 5B:
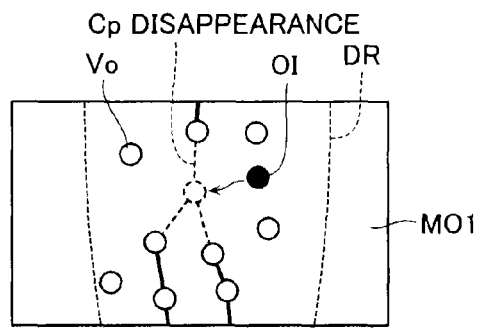
Figure 6A:
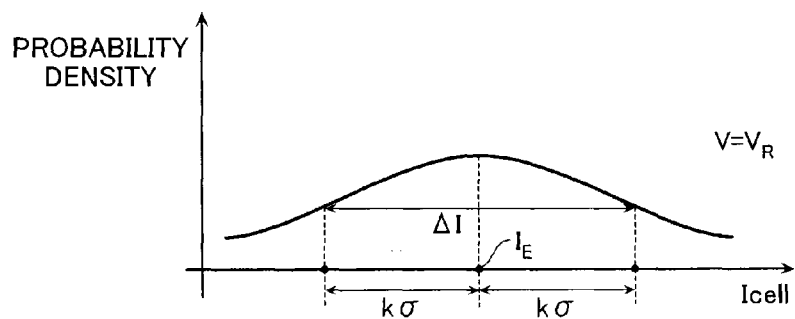
FIG. 6A and FIG. 6B are graphs showing the characteristics of the variable resistance element VR.
Figure 6B:
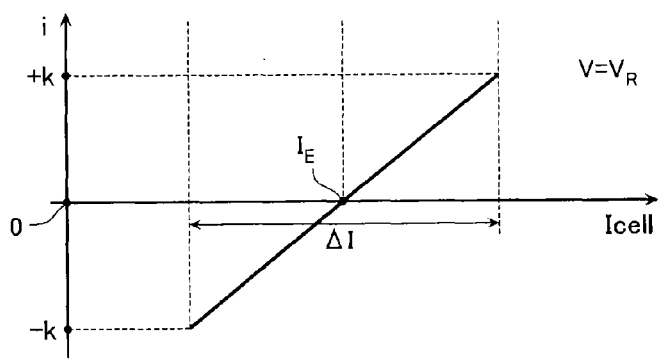

Next, with reference to FIG. 5A, FIG. 5B, FIG. 6A and FIG. 6B, the defect region DR will be described. FIG. 5A and FIG. 5B are schematic cross-sectional views of the defect region DR. FIG. 6A and FIG. 6B are graphs showing the characteristics of the defect region DR shown in FIG. 5A and FIG. 5B. FIG. 6A is a graph showing the distribution of the cell current Icell. In FIG. 6A, the x-axis represents the cell current Icell and the y-axis represents the probability density. FIG. 6B is also a graph showing the distribution of the cell current Icell. In FIG. 6B, the x-axis represents the cell current Icell and the y-axis represents a current value i normalized in a method described below.

Note that in the following discussion, the expectation (average) of the cell current Icell is referred to as an "expectation current" $I_E$, the standard deviation of the cell current Icell is referred to as σ, and the width of the cell current Icell provided within ±kσ around the expectation current $I_E$ is referred to as a "current variation" ΔI. Note, however, that "k" is a positive integer. Note that the current value i shown in the y-axis in FIG. 6B is a value I (=(Icell–$I_E$)/σ) showing the variation of the cell current Icell from the expectation current $I_E$ divided by the standard deviation σ. The value i is hereinafter referred to as a "normalized current value".

As shown in FIG. 5A, the defect region DR in the first metal oxide layer MO1 contains a plurality of oxygen defects Vo. In addition, a current path Cp is formed between the adjacent oxygen defects Vo. Therefore, if a plurality of current paths Cp connects the upper and lower surfaces of the first metal oxide layer MO1, the current paths Cp function as electrically conductive filaments, which decrease the resistance of the memory cell MC.

Here, as shown in FIG. 5B, the oxygen defects Vo may disappear by recombination with oxygen ions OI or the like. In this case, the current paths Cp near the oxygen defects Vo that have disappeared also disappear. In this case, a portion of the filament is cut away, thereby increasing the resistance of the memory cell MC. For example, as shown in FIG. 6A and FIG. 6B, such a phenomenon varies the resistance of the memory cell MC within a predetermined range.

In addition, if the memory cell MC becomes more compact, the number of current paths in the defect region DR is decreased. In this case, the cell current Icell is decreased and the ratio of the current flowing through one path with respect to the whole cell current Icell is increased, thereby increasing the current variation ΔI. More particularly, in the region where the compliance current Icomp described with reference to FIG. 1 is lower than 10 μA, for example, the current variation Δ1 starts to affect particularly the cell current Icell.

[Operation of Variable Resistance Element VR]

Figure 7A:
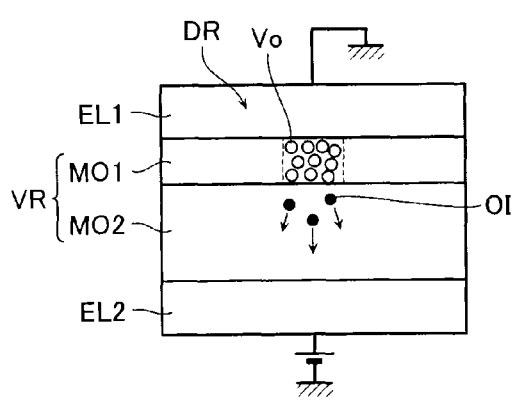
FIG. 7A and FIG. 7B are schematic cross-sectional views for illustrating the operation of the variable resistance element VR.
Figure 7B:
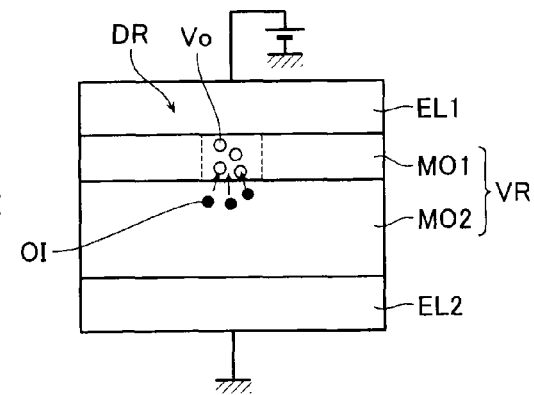
Figure 8A:
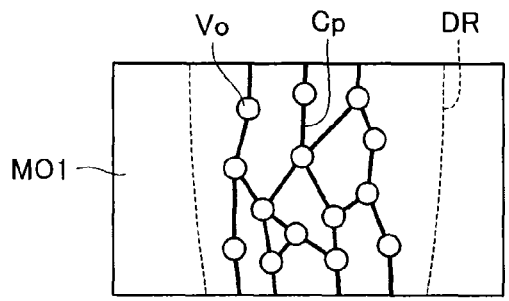
FIG. 8A and FIG. 8B are schematic cross-sectional views of the variable resistance element VR.
Figure 8B:
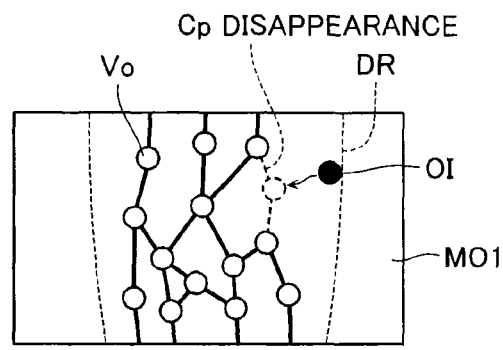
Figure 9:
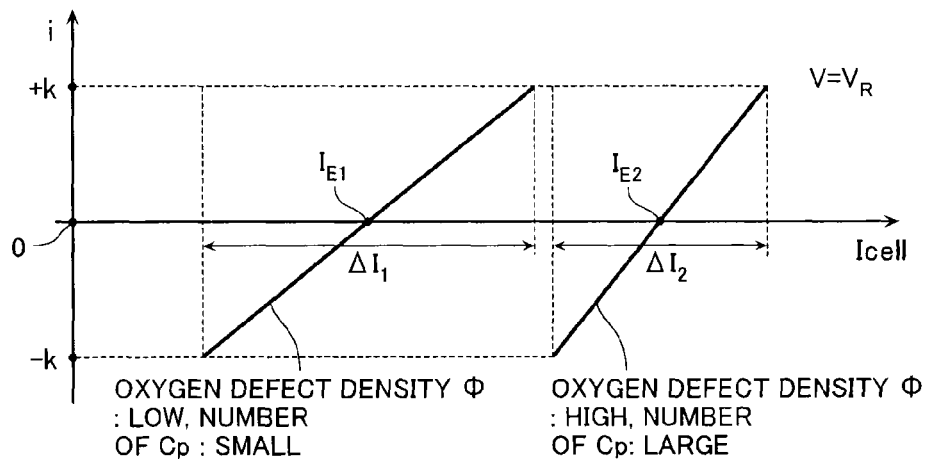
FIG. 9 is a graph showing the characteristics of the variable resistance element VR.

Next, with reference to FIG. 7A, FIG. 7B, FIG. 8A, FIG. 8B and FIG. 9, the operation of the variable resistance element VR will be described. FIG. 7A and FIG. 7B are schematic cross-sectional views for illustrating the operation of the variable resistance element VR. FIG. 8A and FIG. 8B are schematic cross-sectional views of the defect region DR when the oxygen defects Vo are increased as shown in, for example, FIG. 7A. In addition, FIG. 9 is a graph showing the characteristics of the defect region DR shown in FIG. 5A, FIG. 5B, FIG. 8A and FIG. 8B. In FIG. 9, the x-axis represents the cell current Icell and the y-axis represents the current value i normalized in the above method.

As shown in FIG. 7A, the second metal oxidation layer MO2 is set at a higher potential and the first metal oxidation layer MO1 is set at a lower potential. In this case, the oxygen ions OI in the defect region DR move to the second metal oxidation layer MO2, thus generating new oxygen defects Vo in the defect region DR. The defect region DR is thus decreased in resistance. Meanwhile, as shown in FIG. 7B, the first metal oxidation layer MO1 is set at a higher potential and the second metal oxidation layer MO2 is set at a lower potential. In this case, the oxygen ions OI in the second metal oxidation layer MO2 move to the defect region DR and thus the oxygen defects Vo disappear in the defect region DR. The defect region DR is thus increased in resistance.

Note that in the following discussion, as shown in FIG. 7A, the positive voltage direction is defined as the voltage application direction in which the second metal oxidation layer MO2 side is at a higher potential and the first metal oxidation layer MO1 side is at a lower potential. Likewise, as shown in 7B, the negative voltage direction is defined as the voltage application direction in which the first metal oxidation layer MO1 side is at a higher potential and the second metal oxidation layer MO2 side is at a lower potential.

As shown in FIG. 8A, if there is a relatively large number of oxygen defects Vo, there is also a relatively large number of current paths Cp. Therefore, a relatively large number of filaments connect the upper and lower surfaces of the first metal oxide layer MO1, thus providing a relatively low resistance of the memory cell MC. Therefore, as shown in FIG. 9, the expectation current $I_{E2}$ is relatively large.

Meanwhile, as shown in FIG. 5A, if there is a relatively small number of oxygen defects Vo, there is also a relatively small number of current paths Cp. Therefore, a relatively small number of filaments connect the upper and lower surfaces of the first metal oxide layer M01. Therefore, as shown in FIG. 9, the expectation current $I_{E1}$ is relatively small.

In addition, as shown in FIG. 8B, if the density of the oxygen defects Vo (hereinafter referred to as an "oxygen defect density") Φ is relatively high, the number of oxygen defects Vo adjacent to each other is relatively large, so that the ratio of the number of current paths Cp with respect to the number of oxygen defects Vo is relatively large. Therefore, as shown in FIG. 8B, for example, even if a portion of the oxygen defects Vo disappears, a current may be conducted from the upper surface to the lower surface of the first metal oxide layer MO1 via other current paths Cp. Therefore, as shown in FIG. 9, the resistance variation of the memory cell MC may be reduced, thus providing a relatively small current variation $\Delta I_2$.

Meanwhile, as shown in FIG. 5A, if the oxygen defect density Φ is relatively low, the number of oxygen defects Vo adjacent to each other is relatively small, so that the ratio of the number of current paths Cp with respect to the number of oxygen defects Vo is relatively small. Therefore, as shown in FIG. 5B, for example, if a portion of the oxygen defects Vo disappears, it is hard to conduct a current from the upper surface to the lower surface of the first metal oxide layer MO1 via other current paths Cp. Therefore, as shown in FIG. 9, the resistance variation of the memory cell MC may not be reduced, thus providing a relatively large current variation $\Delta I_1$.

[Difference of Variable Resistance Elements VR in Different Memory Cells MC]

Figure 10:
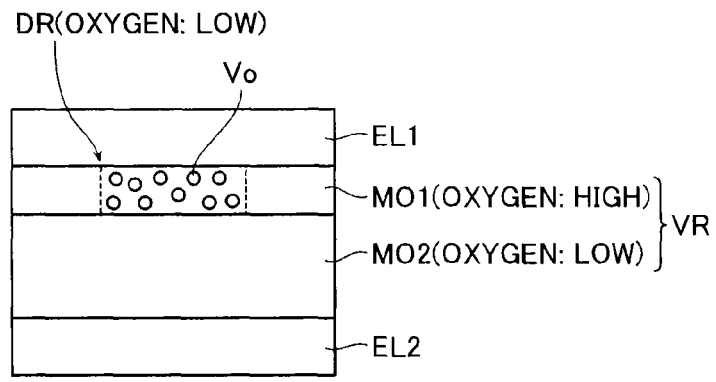
FIG. 10 is a schematic cross-sectional view of another variable resistance element VR.
Figure 11A:
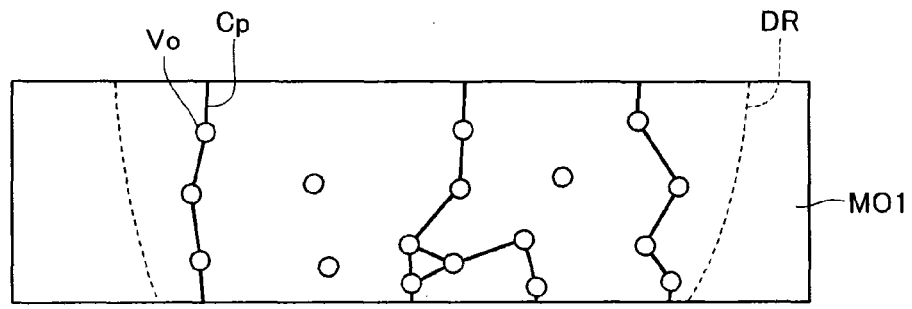
FIG. 11A and FIG. 11B are schematic cross-sectional views of the variable resistance element VR.
Figure 11B:
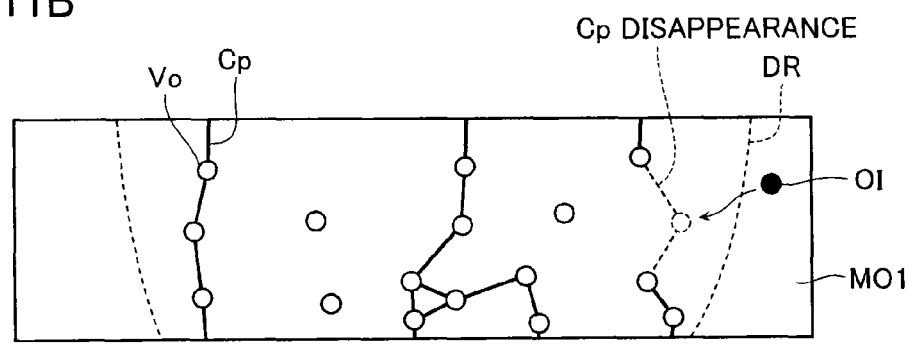
Figure 12:
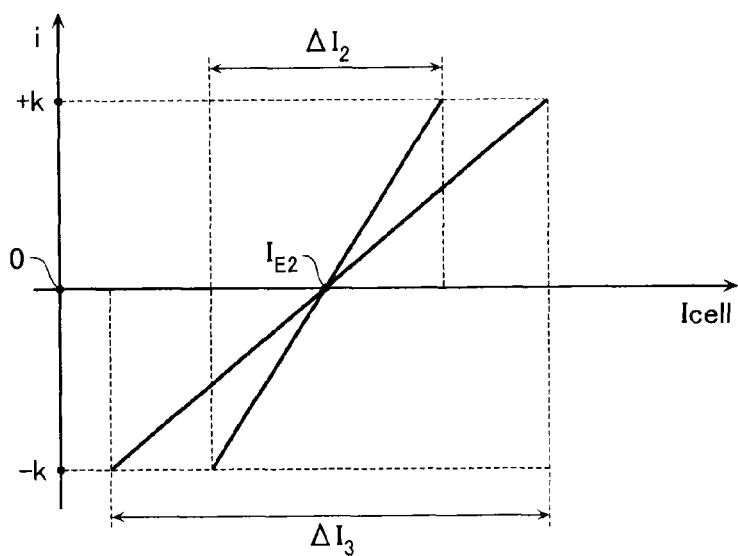
FIG. 12 is a graph showing the characteristics of the variable resistance element VR.

Next, with reference to FIGS. 10 to 12, the difference of the variable resistance elements VR in different memory cells MC will be described. FIG. 10 is a schematic cross-sectional view showing the configuration of a variable resistance element VR included in a memory cell MC different from the memory cell MC including the variable resistance element VR shown in FIG. 4. FIG. 11A and FIG. 11B are schematic cross-sectional views of the defect region DR of the variable resistance element VR shown in FIG. 10. In addition, FIG. 12 is a graph showing the characteristics of the defect region DR shown in FIG. 8A, FIG. 8B, FIG. 11A and FIG. 11B. In FIG. 12, the x-axis represents the cell current Icell and the y-axis represents the current value i normalized in the method described above.

The variable resistance element VR shown in FIG. 10 is basically configured similarly to the variable resistance element VR shown in FIG. 4. However, in the variable resistance element VR shown in FIG. 10, the defect region DR is formed over a wider range than the variable resistance element VR shown in FIG. 4.

It is considered that if the expectation current $I_E$ of the variable resistance element VR shown in FIG. 10 is similar to the expectation current $I_{E2}$ of the variable resistance element VR shown in FIG. 4, as shown in FIG. 11A, the number of formed filaments is similar to that shown in FIG. 8A. Here, in the example shown in FIG. 11A, as the defect region DR is formed over a wide range, the oxygen defect Vo is distributed over a wide range. Therefore, the oxygen defect density Φ is lower than that shown in FIG. 8A.

Therefore, as shown in FIG. 11B, the number of oxygen defects Vo adjacent to each other is relatively small, and thus the ratio of the number of current paths Cp with respect to the number of oxygen defects Vo is relatively small. Therefore, if a portion of the oxygen defects Vo disappears by the oxygen ions OI or the like, it is hard to conduct a current from the upper surface to the lower surface of the first metal oxide layer MO1 via other current paths Cp. Accordingly, as shown in FIG. 12, the resistance variation of the memory cell MC may not be reduced, thus providing a relatively large current variation $\Delta I_3$.

Note that the region where the defect region DR is formed may differ depending on, for example, the distance of the memory cell MC from the row decoder 12 or the column decoder 13. Specifically, the defect region DR is formed, after the memory cell MC is manufactured, by a forming operation of applying a voltage to the variable resistance element VR. In the forming operation, as the distance increases from the row decoder 12, the voltage drop across the word-line WL increases. Likewise, as the distance increases from the column decoder 13, the voltage drop across the bit-line BL increases. This decreases the voltage applied to the memory cell MC in the forming operation, thereby forming the defect region DR over a relatively wide range. Therefore, if the memory cell array 11 becomes large-scaled, the size difference of such defect region DR may be increased between a plurality of memory cells MC.

[Read Operation]

Figure 13:
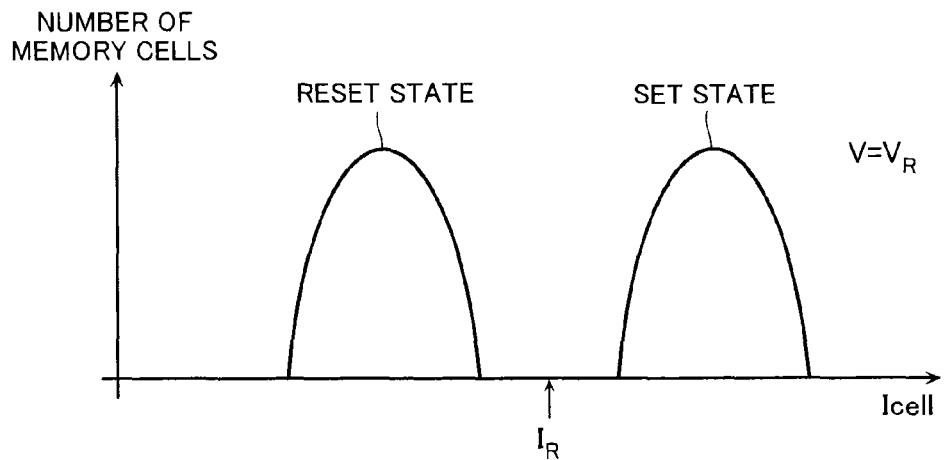
FIG. 13 is a histogram showing a cell current Icell of the memory cell MC.

Next, with reference to FIG. 13, the read operation of the nonvolatile memory device according to this embodiment will be described. FIG. 13 is a histogram showing the cell current Icell of the memory cell MC under the application of a read voltage $V_R$. In FIG. 13, the x-axis schematically represents the amount of the cell current Icell and the y-axis schematically represents the number of memory cells MC.

In this embodiment, as shown in FIG. 13, the resistance of the memory cell MC is adjusted to a high resistance state (reset state) or a low resistance state (set state). In addition, when data is read, the read voltage $V_R$ is applied to the memory cell MC. Here, if the cell current Icell is higher than a read current $I_R$, then it is determined that the memory cell MC is in the set state. Meanwhile, if the cell current Icell is lower than the read current $I_R$, then it is determined that the memory cell MC is in the reset state.

[Set Operation According to First Embodiment]

Figure 14:
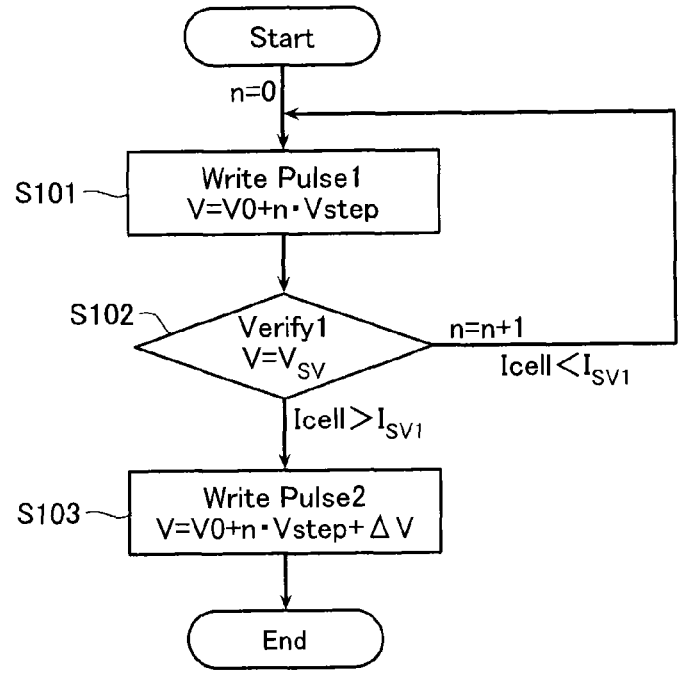
FIG. 14 is a flowchart for illustrating a set operation according to the first embodiment.

Next, with reference to FIG. 14 and FIG. 15, a set operation according to the first embodiment will be described. FIG. 14 is a flowchart for illustrating a method of performing the set operation according to the first embodiment.

As shown in FIG. 14, in the set operation according to this embodiment, after a first voltage application step S101 and a first verify step S102 are repeatedly performed, a second voltage application step S103 is performed to provide additional writing to the selected memory cell MC.

As shown in FIG. 14, in the first voltage application step S101, the selected memory cell MC is applied with V0+nVstep as a first write voltage. Here, the write initial voltage V0 is the initial value of the first write voltage, the step voltage Vstep is the increase width of the first write voltage, and n is an integer representing the number of times the first voltage application step S101 is performed. After the first voltage application step S101 is ended, the first verify step S102 is performed.

As shown in FIG. 14, in the first verify step S102, the selected memory cell MC is applied with a set verify voltage $V_{SV}$ lower than the first write voltage, and the cell current Icell is compared with a first threshold current $I_{SV1}$. The first threshold current $I_{SV1}$ may be set to be equal to or larger than the read current $I_R$, for example. If the cell current Icell is smaller than the first threshold current $I_{SV1}$, then it is determined that the selected memory cell MC does not pass the first verify step S102. In this case, n is incremented by one and the first voltage application step S101 is performed again. Meanwhile, if the cell current Icell is larger than the first threshold current $I_{SV1}$, it is determined that the selected memory cell MC passes the first verify step S102. In this case, the second voltage application step S103 is performed.

As shown in FIG. 14, in the second voltage application step S103, the selected memory cell MC is applied with V0+nVstep+ΔV as a second write voltage. Here, the additional voltage ΔV is the increase width of the second write voltage with respect to the first write voltage. In other words, the second write voltage is higher than the first write voltage by ΔV. After the second voltage application step S103 is ended, the set operation is ended.

Figure 15:
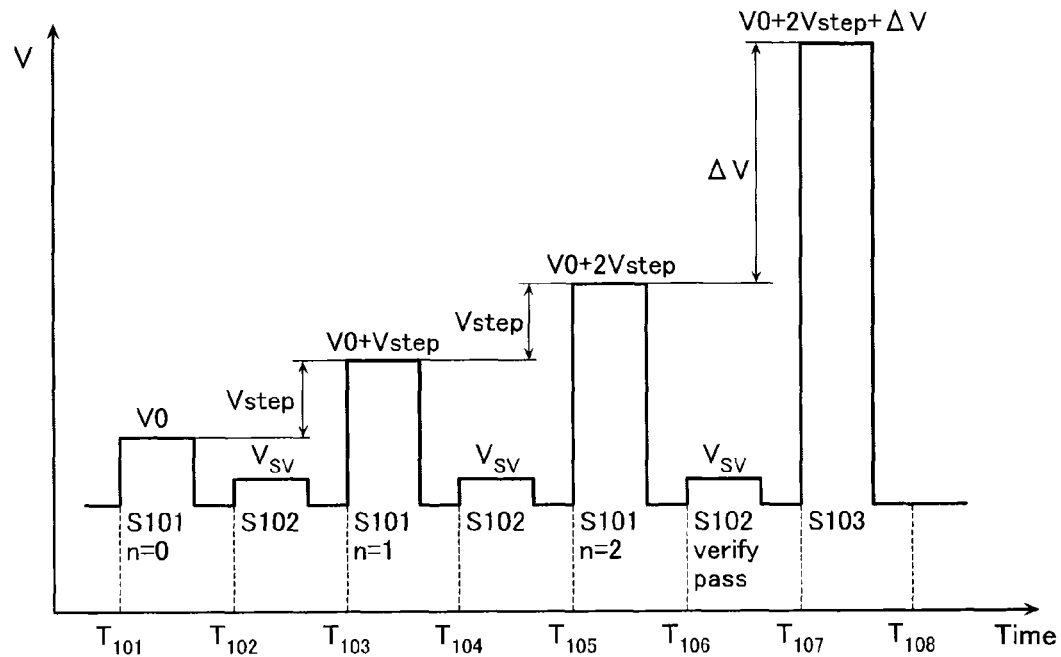
FIG. 15 is a timing diagram for illustrating the same set operation.

FIG. 15 is a timing diagram showing the voltage in case of the set operation according to this embodiment is applied to a predetermined memory cell MC.

At the timings $T_{101}$ to $T_{102}$, the first voltage application step S101 is performed. In this case, because of n=0, the memory cell MC is applied with V0 as the first write voltage. Thus, as described with reference to FIG. 7A, the oxygen defects Vo are generated in the defect region DR.

At the timings $T_{102}$ to $T_{103}$, the first verify step S102 is performed. Therefore, the memory cell MC is applied with the set verify voltage $V_{SV}$. Here, in the example shown in FIG. 15, at the timings $T_{102}$ to $T_{103}$, the selected memory cell MC does not pass the first verify step S102.

At the timings $T_{103}$ to $T_{107}$, with n being incremented by one, the first voltage application step S101 and the first verify step S102 are repeatedly performed. Thus, as described with reference to FIG. 7A, the oxygen defects Vo are further generated in the defect region DR. Here, in the example shown in FIG. 15, at the timings $T_{106}$ to $T_{107}$, the selected memory cell MC passes the first verify step S102.

At the timings $T_{107}$ to $T_{108}$, the second voltage application step S103 is performed. In this case, because of n=2, the memory cell MC is applied with V0+2Vstep+ΔV as the second write voltage. Thus, as described with reference to FIG. 7A, the oxygen defects Vo are further generated in the defect region DR. When the second voltage application step S103 is ended, the set operation is ended.

[Set Operation According to Comparative Example]

Figure 16:
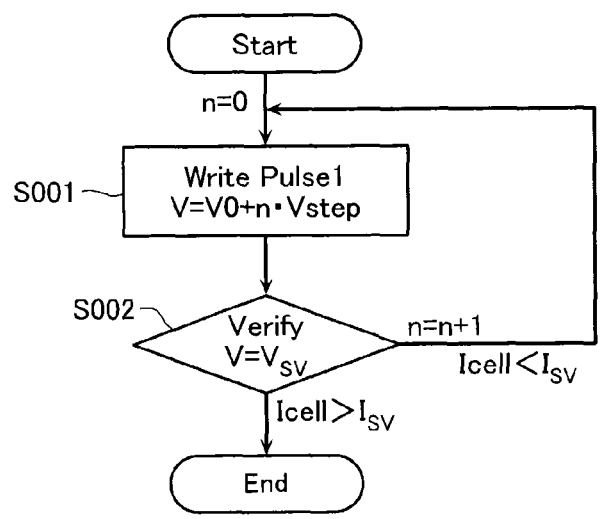
FIG. 16 is a flowchart for illustrating a set operation according to a comparative example.
Figure 17:
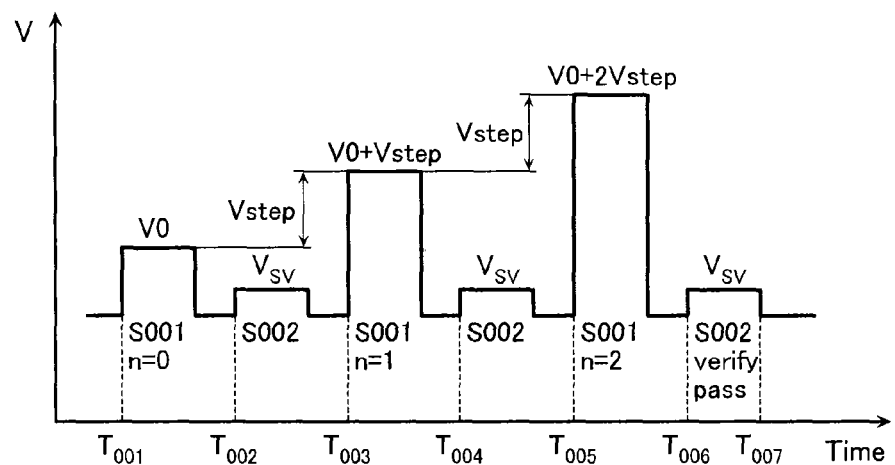
FIG. 17 is a timing diagram for illustrating the same set operation.

Next, with reference to FIG. 16 and FIG. 17, a set operation according to a comparative example will be described. FIG. 16 is a flowchart for illustrating the method of the set operation according to the comparative example. In addition, FIG. 17 is a timing diagram showing the voltage of a predetermined memory cell MC applied with the set operation according to the comparative example.

As shown in FIG. 16, the set operation according to the comparative example does not perform the second voltage application step S103 unlike the set operation according to the first embodiment. Therefore, as shown in FIG. 16 and FIG. 17, the set operation according to the comparative example is ended when the selected memory cell MC passes the verify step S002.

Note that the set operation according to the comparative example is similar in other respects to the set operation according to the first embodiment, and thus the voltage application step S001 in FIG. 16 is performed similarly to the first voltage application step S101 in FIG. 14, and the verify step S002 in FIG. 16 is performed similarly to the first verify step S102 in FIG. 14. In addition, at the timings $T_{001}$ to $T_{007}$ in FIG. 17, the set operation is performed similarly to that at the timings $T_{101}$ to $T_{107}$ in FIG. 15.

[Comparison of Set Operation According to First Embodiment and Set Operation According to Comparative Example]

Next, with reference to FIG. 18 to FIG. 21, a comparison is made between the set operation according to the first embodiment and the set operation according to the comparative example.

Figure 18:
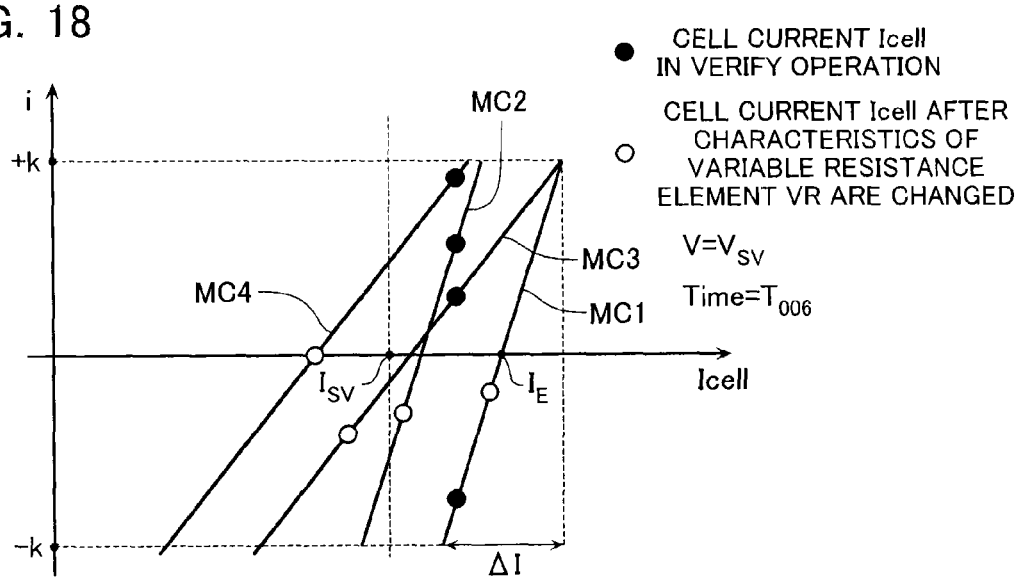
FIG. 18 is a graph for illustrating the same set operation.
Figure 19:
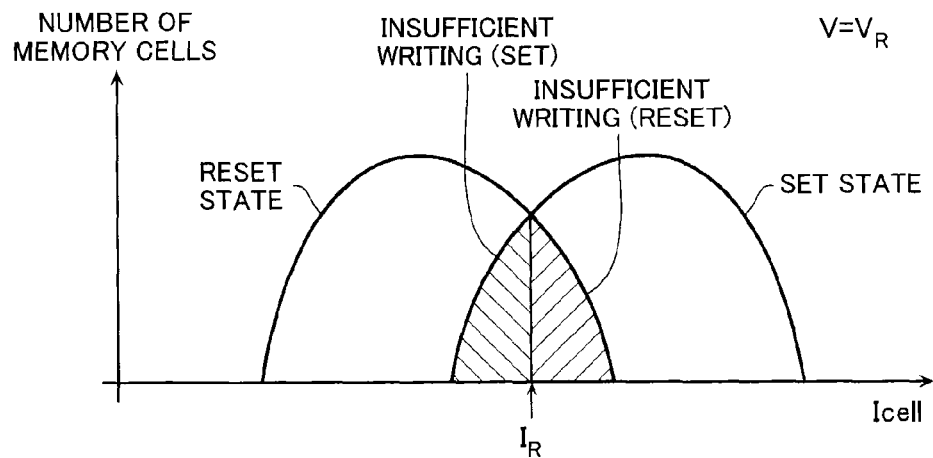
FIG. 19 is a histogram for illustrating the same set operation.

First, as shown in FIG. 18 and FIG. 19, the set operation according to the comparative example will be described. FIG. 18 is a graph showing the cell currents Icell of a plurality of memory cells MC having various characteristics after the set operation according to the comparative example is performed to those memory cells MC. In FIG. 18, the x-axis represents the cell current and the y-axis represents the above normalized current value i. In addition, the straight lines in FIG. 18 represent the distribution of the cell currents Icell of the memory cells MC1 to MC4 of different characteristics at the timing $T_{006}$ immediately before passing the verify step S002. In addition, the closed circles in FIG. 18 represent the cell currents Icell acquired in the final verify step S002 performed at the timing $T_{006}$, and the open circles represent the cell currents Icell after the characteristics of the variable resistance element VR are changed.

As described with reference to FIG. 16 and FIG. 17, in the set operation according to the comparative example, the selected memory cell MC is applied with the set verify voltage $V_{SV}$, and when the resulting cell current Icell exceeds the threshold current $I_{SV}$, the set operation is ended. But, as described with reference to FIG. 4 and FIG. 10, the memory cell array 11 comprises a plurality of memory cells MC having different characteristics. Therefore, as shown by the closed circles in FIG. 18 for example, the set operation may not be performed sufficiently even if a cell current Icell higher than the threshold current $I_{SV}$ is obtained in the verify step S002. Specifically, the expectation current $I_E$ may be insufficiently large or the current variation ΔI may be insufficiently reduced. In such a case, as shown by the open circles, after the set operation is ended, the resistance of the memory cell MC may be increased to an unintended large level. For example, it is hard to say that the set operation is sufficiently performed if, like the memory cells MC2 and MC4 in FIG. 18, the resistance of the memory cell MC is changed after the set operation is ended and the cell current Icell under the application of the set verify voltage $V_{SV}$ falls below the threshold current I. At least, if the cell current Icell under the application of the read voltage $V_R$ is smaller than the read current $I_R$, it may not be said that the set operation is performed sufficiently.

FIG. 19 is a histogram showing the cell current Icell of the memory cell MC under the application of the read voltage $V_R$. In FIG. 19, the x-axis schematically represents the amount of the cell current Icell and the y-axis schematically represents the number of memory cells MC.

As described with reference to FIG. 13, the resistance of the memory cell MC is adjusted to the high resistance state (reset state) or the low resistance state (set state). But, as described with reference to FIG. 18, for example, even in the memory cell MC to which the set operation has been performed, the cell current Icell under the application of the read voltage $V_R$ may fall below the read current $I_R$, resulting in a wrong determination (bit error) that the memory cell MC is in the reset state. Note that such a problem similarly occurs in the reset operation.

Note that if, for example, the nonvolatile memory device according to this embodiment comprises the ECC circuit, it is preferable that the amount of the wrong determination (bit error) is limited to at least a range that may be detected/ corrected by the ECC circuit.

Figure 20:
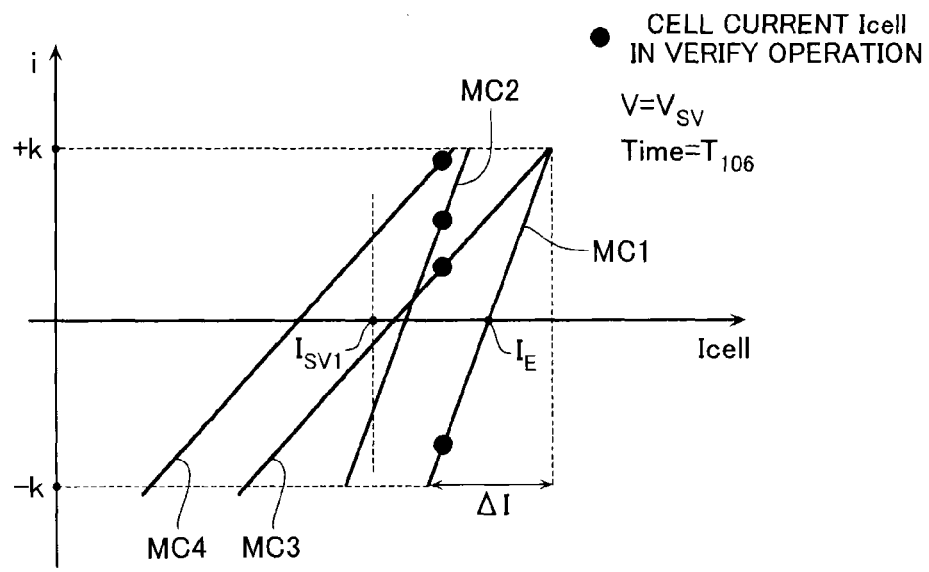
FIG. 20 is a graph for illustrating the set operation according to the first embodiment.
Figure 21:
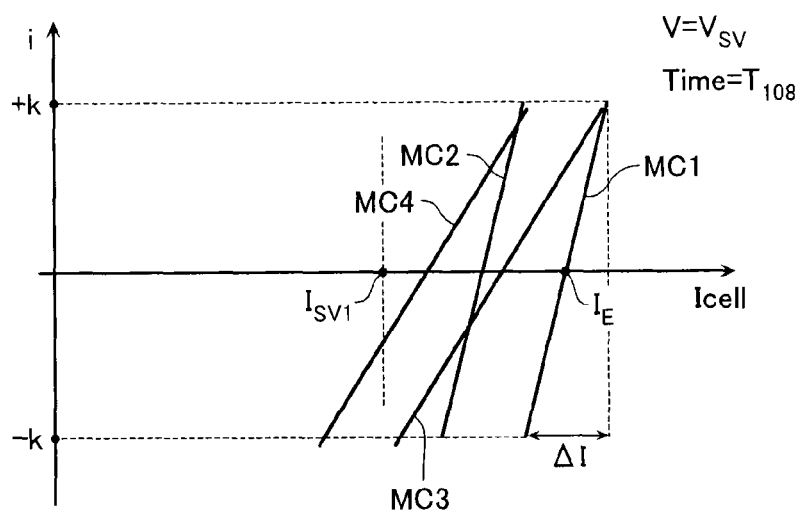
FIG. 21 is a graph for illustrating the same set operation.

Next, with reference to FIG. 20 and FIG. 21, the set operation according to the first embodiment will be described. FIG. 20 and FIG. 21 are graphs showing the cell currents Icell of a plurality of memory cells MC having various characteristics after the set operation according to this embodiment is performed to those memory cells Icell. In FIG. 20 and FIG. 21, the x-axis represents the cell current and the y-axis represents the above normalized current value i. In addition, the straight lines in FIG. 20 represent the distribution of the cell current Icell of the memory cells MC1 to MC4 of different characteristics at the timing $T_{106}$ when the first verify step S102 is passed. Further, the closed circles in FIG. 20 represent the cell currents Icell acquired in the final first verify step S102 performed at the timing $T_{106}$. In addition, the straight lines in FIG. 21 represent the distributions of the cell currents Icell of the memory cells MC1 to M4 at the timing $T_{108}$ after the set operation is ended.

As shown in FIG. 14 and FIG. 15, in the set operation according to this embodiment, the first voltage application step S101 and the first verify step S102 are repeatedly performed. Therefore, as shown in FIG. 20, at the timing $T_{106}$, the filament is formed in the variable resistance element VR to a degree that at least the cell current Icell under the application of the first verify voltage $V_{SV1}$ accidentally exceeds the first threshold current $I_{SV1}$.

Here, as shown in FIG. 14 and FIG. 15, in the set operation according to this embodiment, after the selected memory cell MC passes the first verify step S102, the second voltage application step S103 is performed. In the second voltage application step S103, the selected memory cell MC is applied with the second write voltage. Therefore, as described with reference to FIG. 7A, the oxygen defects Vo may further be generated in the defect region DR to stabilize the filaments. Thus, as shown in FIG. 21, at the timing $T_{108}$ when the second voltage application step S103 is ended, the expectation current $I_E$ may be increased and the current variation $\Delta I$ may be decreased to reduce the generation of the insufficient writing.

In addition, in the set operation according to this embodiment, the second voltage application step S103 is performed to all memory cells MC. Therefore, the second voltage application step S103 can be performed without determining whether the step S103 is necessary or not. The set operation can thus be performed relatively rapidly.

In addition, in the set operation according to this embodiment, the second write voltage is higher than the first write voltage. Therefore, in the second voltage application step S103, the oxygen defects $V_O$ in the memory cell MC can be suitably increased. Note, however, that, for example, the second write voltage may also be set similar to the first write voltage ($\Delta V$ may be set to zero).

Second Embodiment

Figure 22:
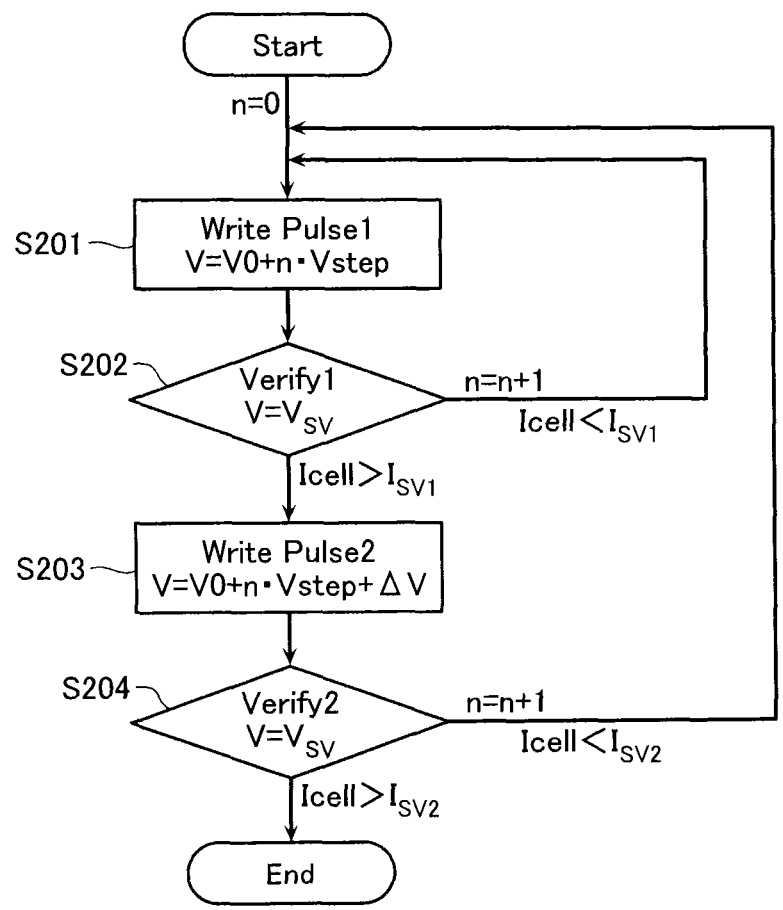
FIG. 22 is a flowchart for illustrating a set operation according to a second embodiment.

Next, with reference to FIG. 22 to FIG. 24, a second embodiment will be described. FIG. 22 is a flowchart for illustrating a method of performing a set operation according to this embodiment. Note that in the following discussion, like elements as those in the first embodiment are designated with like reference numerals and their description is omitted here.

As shown in FIG. 22, in the set operation according to this embodiment, after performing the first voltage application step S201, the first verify step S202 and the second voltage application step S203 are performed, a second verify step S204 is further performed. In addition, if the selected memory cell MC does not pass the second verify step S204, then the four steps are repeatedly performed until it is passed.

Note that the set operation according to the second embodiment is similar in other respects to the set operation according to the first embodiment, and thus the first voltage application step S201 in FIG. 22 is performed similarly to the first voltage application step S101 in FIG. 14, and the first verify step S202 in FIG. 22 is performed similarly to the first verify step S102 in FIG. 14. In addition, the second voltage application step S203 in FIG. 22 is performed similarly to the second voltage application step S103 in FIG. 14.

As shown in FIG. 22, in the second verify step S204, the selected memory cell MC is applied with the set verify voltage $V_{SV}$, and the cell current Icell is compared with a second threshold current $I_{SV2}$. In this embodiment, the second threshold current $I_{SV2}$ is higher than the first threshold current $I_{SV1}$. Note, however, that the second threshold current $I_{SV2}$ may be the same as the first threshold current $I_{SV1}$ or smaller than the first threshold current $I_{SV1}$. If the cell current Icell is smaller than the second threshold current $I_{SV2}$, it is determined that the selected memory cell MC does not pass the second verify step S204. In this case, n is incremented by one and the first voltage application step S201 is performed again. Meanwhile, if the cell current Icell is larger than the second threshold current $I_{SV2}$, it is determined that the selected memory cell MC passes the second verify step S204. In this case, the set operation is ended.

Figure 23:
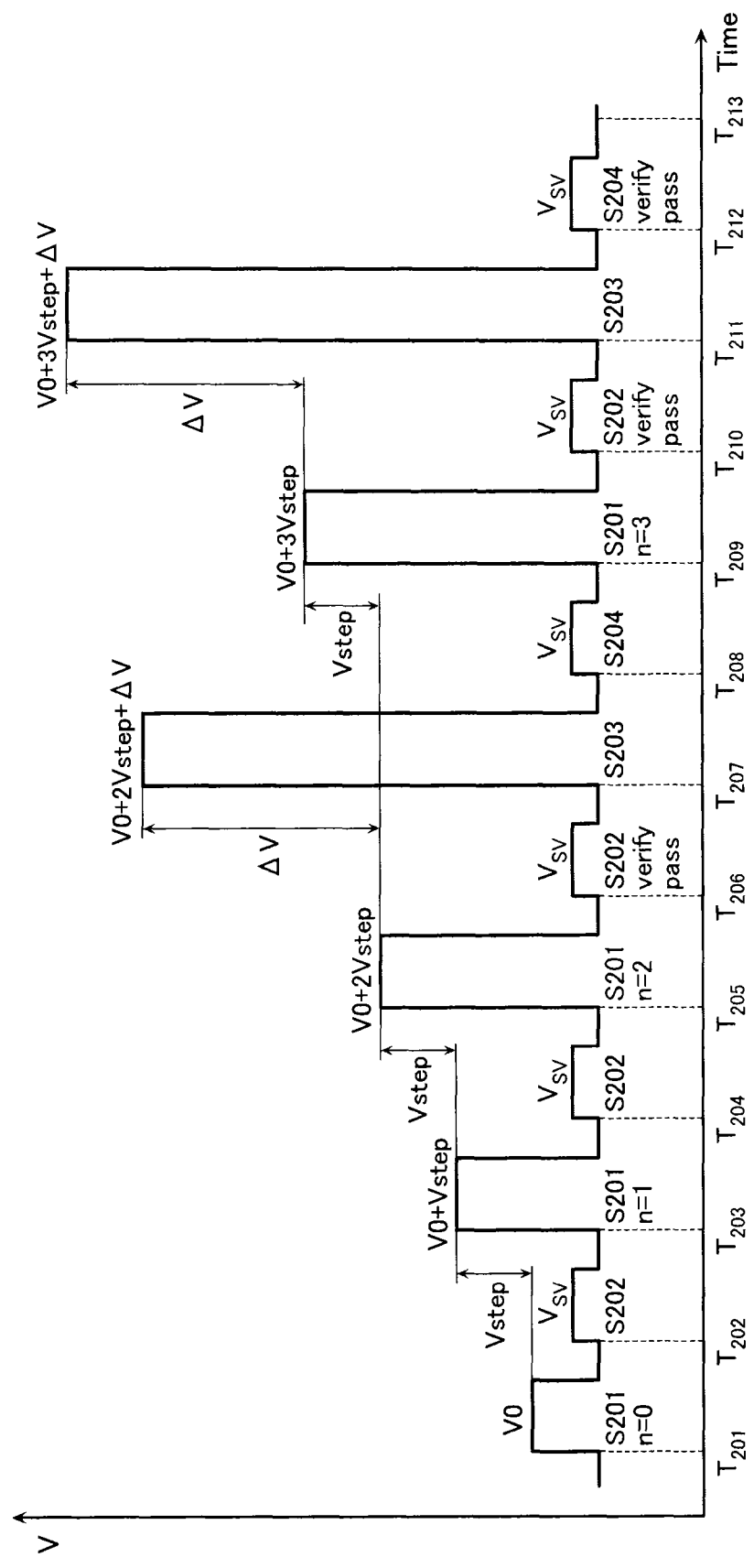
FIG. 23 is a timing diagram for illustrating the same set operation.

FIG. 23 is a timing diagram showing the voltage in case of the set operation according to this embodiment is applied to a predetermined memory cell MC. At the timings $T_{201}$ to $T_{208}$ in FIG. 23, the set operation is performed similarly to that at the timings $T_{101}$ to $T_{108}$ in FIG. 15.

At the timings $T_{208}$ to $T_{209}$, the second verify step S204 is performed. Therefore, the memory cell MC is applied with the set verify voltage $V_{SV}$. Here, in the example shown in FIG. 23, at the timings $T_{208}$ to $T_{209}$, the selected memory cell MC does not pass the second verify step S204.

At the timings $T_{209}$ to $T_{213}$, n is incremented by one, the first voltage application step S101, the first verify step S102, the second voltage application step S203, and the second verify step S204 are further performed. Thus, as described with reference to FIG. 7A, the oxygen defects Vo are further generated in the defect region DR. Here, in the example shown in FIG. 23, at the timings $T_{212}$ to $T_{213}$ the selected memory cell MC passes the second verify step S204. Therefore, the set operation is ended here.

Figure 24:
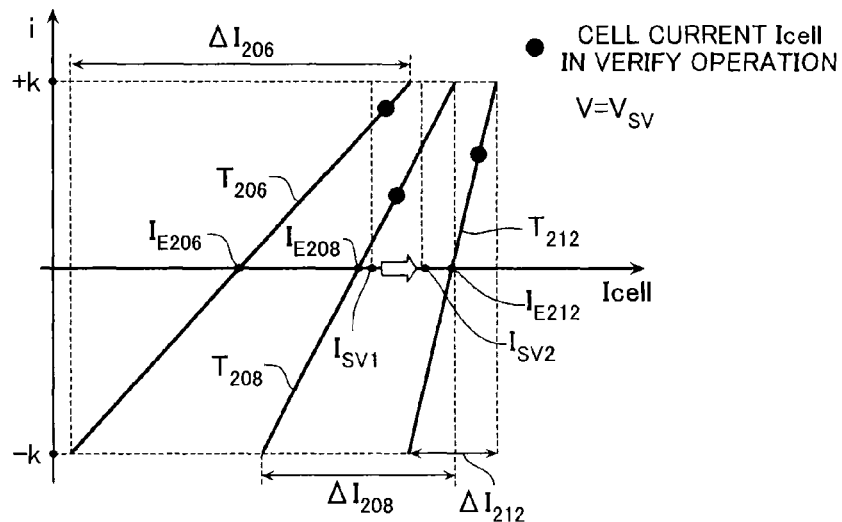
FIG. 24 is a graph for illustrating the same set operation.

FIG. 24 is a graph showing the cell currents Icell of a predetermined memory cell MC when the set operation according to this embodiment is performed to the memory cell MC. In FIG. 24, the x-axis represents the cell current Icell and the y-axis represents the above normalized current value i. In addition, the straight lines in FIG. 24 represent the distribution of the cell currents Icell of the memory cell MC at the different timings $T_{206}$, $T_{208}$ and $T_{212}$. In addition, the closed circles in FIG. 24 represent the cell currents Icell acquired in the first verify step S202 or the second verify step S204 performed at the timings $T_{206}$, $T_{208}$ and $T_{212}$. Here, at the timings $T_{206}$, $T_{208}$ and $T_{212}$, the expectation currents are $I_{E206}/I_{E208}$ an and the and $I_{E212}$, current variations are $\Delta I_{206}$, $\Delta I_{208}$ and $\Delta I_{212}$.

As shown in FIG. 22 and FIG. 23, in this embodiment, after the second voltage application step S203 is ended, the second verify step S204 is further performed. Here, as shown in FIG. 24, the second write step S203 is performed between the timing $T_{206}$ and the timing $T_{208}$, thereby decreasing the current variation from $\Delta I_{206}$ to $\Delta I_{208}$. Therefore, it is considered that, in the second verify step S204 performed between the timings $T_{208}$ to $T_{209}$, the current closer to the expectation current $I_{E208}$ than the current detected by the first verify step S202 performed between the timings $T_{206}$ to $T_{207}$ is detected. In other words, it is considered that, in the second verify step S204, the state of the selected memory cell MC is detected more reliably than the first verify step S202 performed immediately before the second verify step S204. Therefore, by the method according to this embodiment, the probability in which the insufficient writing occurs can be reduced further.

In addition, as shown in FIG. 24, in this embodiment, the second threshold current $I_{SV2}$ is set higher than the first threshold current Here, as shown in FIG. 24, between the timing $T_{208}$ and the timing $T_{212}$, the expectation current increases from $I_{E208}$ to $I_{E212}$. Here, in the second verify step S204, the state of the selected memory cell MC can be detected more reliably than that in the first verify step S202. Therefore, it is considered that the expectation current $I_{E212}$ when the second verify step S204 is passed has a value close to the second threshold current $I_{SV2}$. Therefore, by the method in this embodiment, an adjustment to increase the whole or a large part of the range of the current variation $\Delta I_{212}$ at the timing $T_{212}$ larger than the first threshold current $I_{SV1}$ is performed. Therefore, the probability in which the insufficient writing occurs can be further reduced.

Third Embodiment

Figure 25:
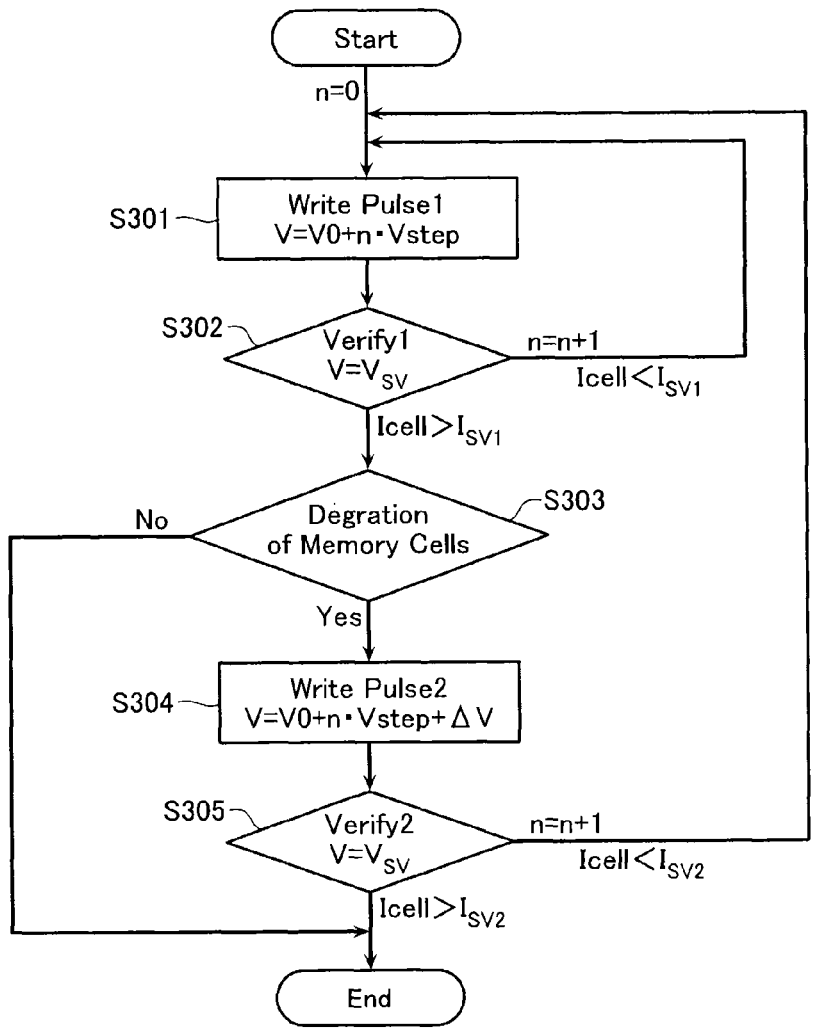
FIG. 25 is a flowchart for illustrating a set operation according to a third embodiment.

Next, with reference to FIG. 25, a third embodiment will be described. FIG. 25 is a flowchart for illustrating a method of performing a set operation according to this embodiment. Note that in the following discussion, like elements as those in the first embodiment are designated with like reference numerals and their description is omitted here.

As described with reference to FIG. 4, the first metal oxide layer MO1 has a defect region DR formed therein that contains less oxygen and has a lower resistance. Here, the defect region DR may be enlarged by rewriting the memory cell MC or the like. This increases, as described with reference to FIG. 10 to FIG. 12 for example, the current variation $\Delta I$. If such a phenomenon occurs in many memory cells MC, the amount of the wrong determination (bit error) as described with reference to FIG. 19 is increased.

As shown in FIG. 25, in the set operation according to this embodiment, the degradation degree of the memory cell MC is determined from, for example, the amount of the wrong determination (the amount of the bit error), and according to the results, the second voltage application step S304 and the second verify step S305 are performed or omitted. Therefore, in the set operation according to this embodiment, the set operation can be performed rapidly if the memory cell MC is not being degraded and performed reliably if the memory cell MC is being degraded.

Note that the first voltage application step S301 in FIG. 25 is performed similarly to the first voltage application step S101 in FIG. 14, and the first verify step S302 in FIG. 25 is performed similarly to the first verify step S102 in FIG. 14. In addition, the second voltage application step S304 in FIG. 25 is performed similarly to the second voltage application step S103 in FIG. 14, and the second verify step S305 in FIG. 25 is performed similarly to the second verify step S204 in FIG. 22.

In addition, as a method of detecting the degradation degree of the memory cell MC, various modes are considered. It is considered for example that the amount of the wrong determination (bit error) detected by devices such as the ECC circuit is stored in advance and compared with a predetermined value.

Note that in this embodiment, if it is detected that the memory cell MC is being degraded, the second voltage application step S304 and the second verify step S305 are omitted, but the second voltage application step S304 may be performed and only the second verify step S305 may be omitted, for example. In addition, in this embodiment, if the selected memory cell MC does not pass the second verify step S305, then control is returned to the first voltage application step S301, which resumes the set operation. But, if, for example, the selected memory cell MC does not pass the second verify step S305, then control may be returned to the second voltage application step S304. In addition, in this embodiment, if it is detected that the memory cell MC is being degraded, then the second voltage application step S304 and the second verify step S305 are performed. But, for example, only the second voltage application step S304 may be performed. Further, depending on the degradation degree of the memory cell MC, these methods may be selectively performed to adjust the set operation in a stepwise fashion.

Fourth Embodiment

Figure 26:
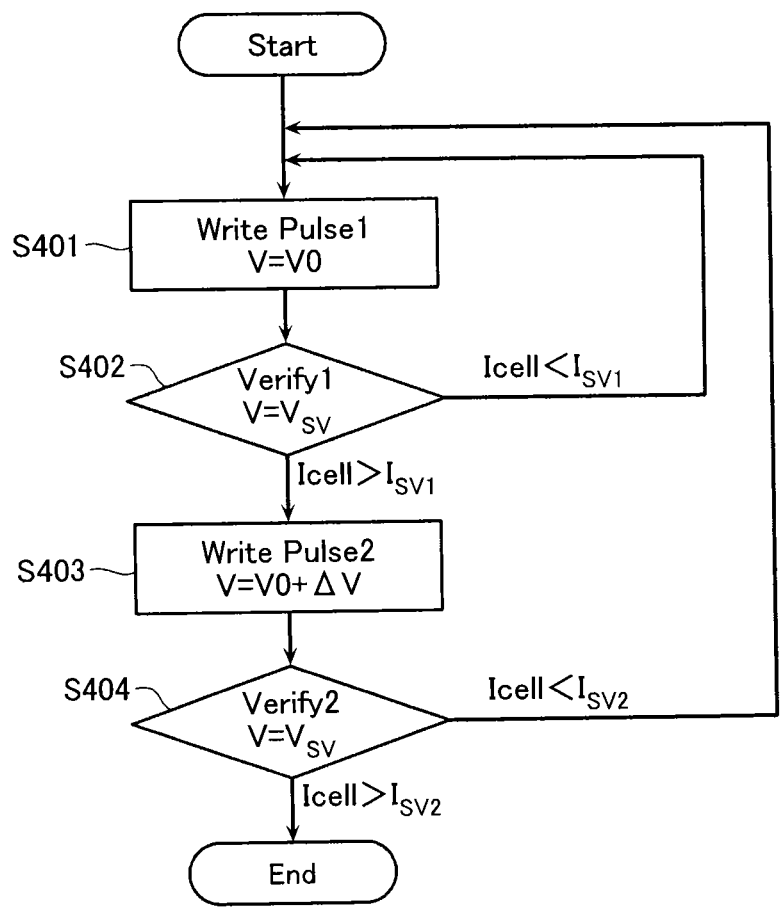
FIG. 26 is a flowchart for illustrating a set operation according to a fourth embodiment.
Figure 27:
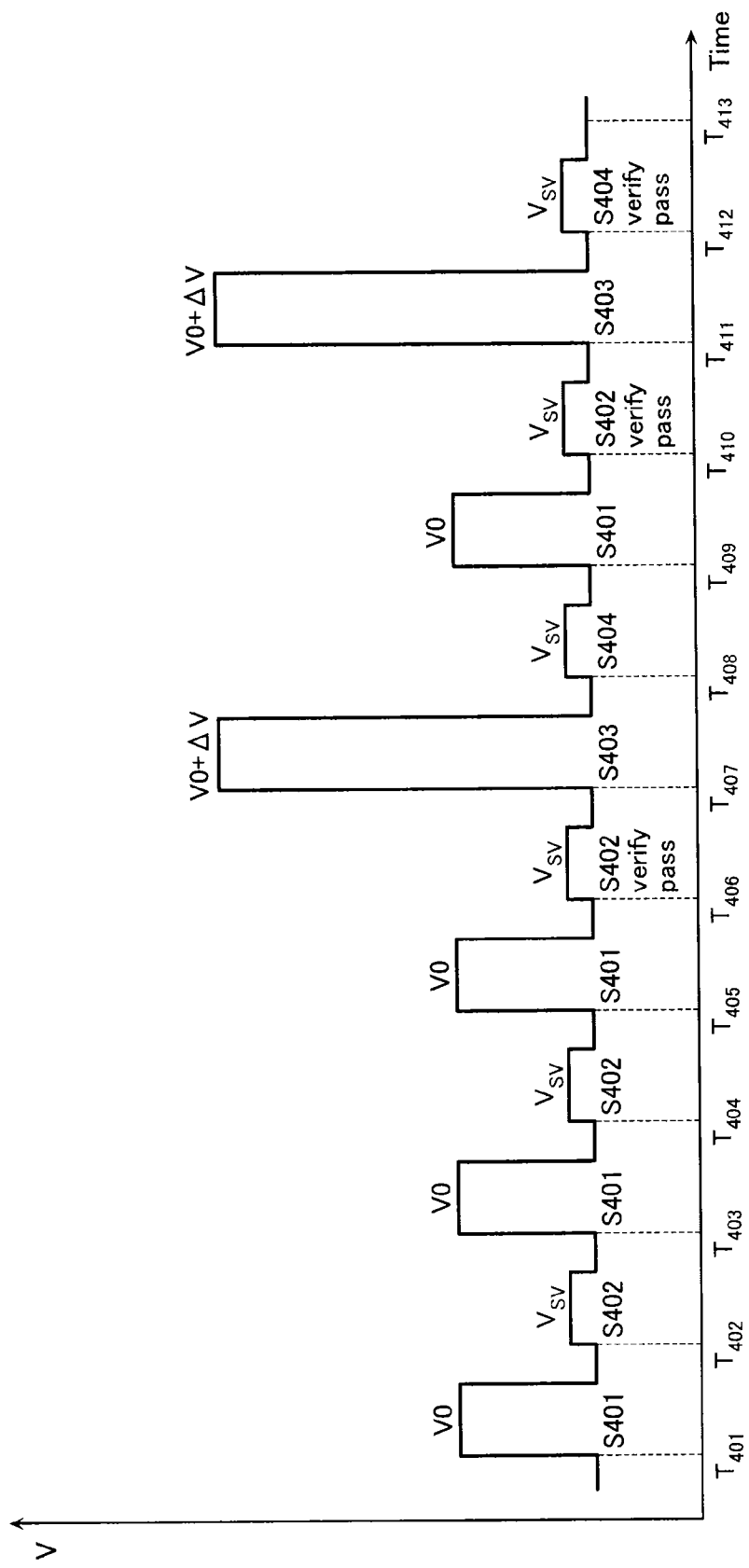
FIG. 27 is a timing diagram for illustrating the same set operation.

Next, with reference to FIG. 26 and FIG. 27, a fourth embodiment will be described. FIG. 26 is a flowchart for illustrating a method of performing a set operation according to this embodiment. In addition, FIG. 27 is a timing diagram showing the voltages of a predetermined memory cell MC applied with the set operation according to this embodiment. Note that in the following discussion, like elements as those in the first embodiment are designated with like reference numerals and their description is omitted here.

In the first to third embodiments, the amount of the first write voltage is gradually increased to perform the set operation. But, as shown in FIG. 26 and FIG. 27, in this embodiment, the first write voltage is set to a certain amount before the set operation.

Specifically, as shown in FIG. 26, in the first voltage application step S401, the selected memory cell MC is applied with V0 as the first write voltage. In addition, in the second voltage application step S403, the selected memory cell MC is applied with V0+$\Delta$V as the second write voltage. Specifically, in this embodiment, the first write voltage is fixed to the write initial voltage V0, and the second write voltage is fixed to the write initial voltage V0+ΔV.

Note that the set operation according to the fourth embodiment is similar in other respects to the set operation according to the second embodiment. Specifically, the first verify step S402 is performed almost similarly to the first verify step S102 shown in FIG. 14, and the second verify step S404 is performed almost similarly to the second verify step S204 shown in FIG. 22. In addition, at the timings $T_{401}$ to $T_{413}$ in FIG. 27, the set operation is performed similarly to that at the timings $T_{201}$ to $T_{213}$ in FIG. 23 except that the first and second write voltages are fixed to certain voltages.

Note that although the second verify step S404 is performed in this embodiment, the second verify step S404 may be omitted. In addition, for example, the degradation of the memory cell MC may be verified and if the degradation of the memory cell MC is not detected, then the second voltage application step S403 and the second verify step S404 may be omitted.

Fifth Embodiment

Figure 28:
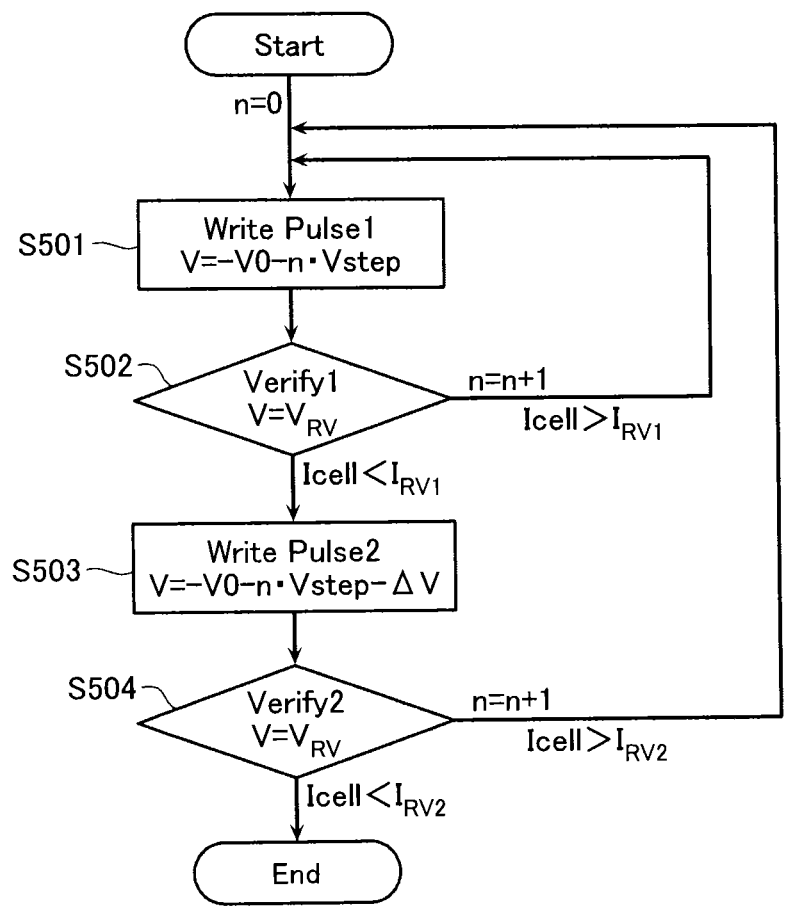
FIG. 28 is a flowchart for illustrating a reset operation according to a fifth embodiment.

Next, with reference to FIG. 28 to FIG. 30, a fifth embodiment will be described. FIG. 28 is a flowchart for illustrating a method of performing a reset operation according to this embodiment. Note that in the following discussion, like elements as those in the first embodiment are designated with like reference numerals and their description is omitted here.

Although the first to fourth embodiments are described with respect to the set operation, the fifth embodiment will be described with respect to the reset operation.

In the first embodiment, as shown in FIG. 5A and FIG. 8A, it is described that if the oxygen defect density Φ is relatively low, the current variation $ΔI_1$ is relatively large. But, if the oxygen defects Vo further continue to decrease in the defect region DR and the oxygen defect density Φ continues to decrease, the number of oxygen defects Vo that form the current paths is decreased. Here, even if the oxygen defects Vo disappear by, for example, the recombination with the oxygen ions IO or the like, such disappearance of the oxygen defects Vo do not contribute to the resistance of the memory cell MC if the oxygen defects Vo that disappear do not originally form the current paths. Therefore, if the oxygen defect density Φ in the defect region DR is further decreased, the current variation starts to gradually decrease. Therefore, in the reset operation, the additional writing may decrease the current variation, thereby reducing the occurrence of the insufficient writing.

As shown in FIG. 28, in the reset operation according to this embodiment, the first write voltage applied to the selected memory cell MC in the first voltage application step S501 and the second write voltage applied to the selected memory cell MC in the second voltage application step S503 are applied in the negative direction. In addition, this embodiment is described with respect to the reset operation, and thus, in order for the selected memory cell MC to pass the first verify step S502 and the second verify step S504, the cell current Icell should satisfy conditions different from those in the first to fourth embodiments.

As shown in FIG. 28, in the first voltage application step S501, the selected memory cell MC is applied with a negative direction voltage −V0−nVstep as the first write voltage. Here, the step voltage Vstep is the decrease width (the increase width in absolute value) of the first write voltage.

As shown in FIG. 28, in the first verify step S502, the selected memory cell MC is applied with a reset verify voltage $V_{RV}$ smaller than the first write voltage, and the cell current Icell is compared with a first threshold current $I_{RV1}$. The first threshold current $I_{RV1}$ may be set to the read current $I_R$ or smaller, for example. If the cell current Icell is larger than the first threshold current $I_{RV1}$, then it is determined that the selected memory cell MC does not pass the first verify step S502. Meanwhile, if the cell current Icell is smaller than the first threshold current $I_{RV1}$, then it is determined that the selected memory cell MC passes the first verify step S502.

As shown in FIG. 28, in the second voltage application step S503, the selected memory cell MC is applied with a negative direction voltage −V0−nVstep−ΔV as the second write voltage. Here, the additional voltage ΔV is the decrease width (the increase width in absolute value) of the second write voltage with respect to the first write voltage. Specifically, the second write voltage is lower (larger in absolute value) than the first write voltage by ΔV. After the second voltage application step S503 is ended, the second verify step S504 is performed.

As shown in FIG. 28, in the second verify step S504, the selected memory cell MC is applied with the reset verify voltage $V_{RV}$, and the cell current Icell is compared with a second threshold current $I_{RV2}$. In this embodiment, the second threshold current $I_{RV2}$ is smaller than the first threshold current $I_{RV1}$. Note, however, that the second threshold current $I_{RV2}$ may be the same as the first threshold current $I_{RV1}$ or larger than the first threshold current $I_{RV1}$. If the cell current Icell is larger than the second threshold current $I_{RV2}$, it is determined that the selected memory cell MC does not pass the second verify step S504. In this case, n is incremented by one and the first voltage application step S201 is performed again. Meanwhile, if the cell current Icell is smaller than the second threshold current $I_{RV2}$, it is determined that the selected memory cell MC passes the second verify step S504. In this case, the set operation is ended.

Figure 29:
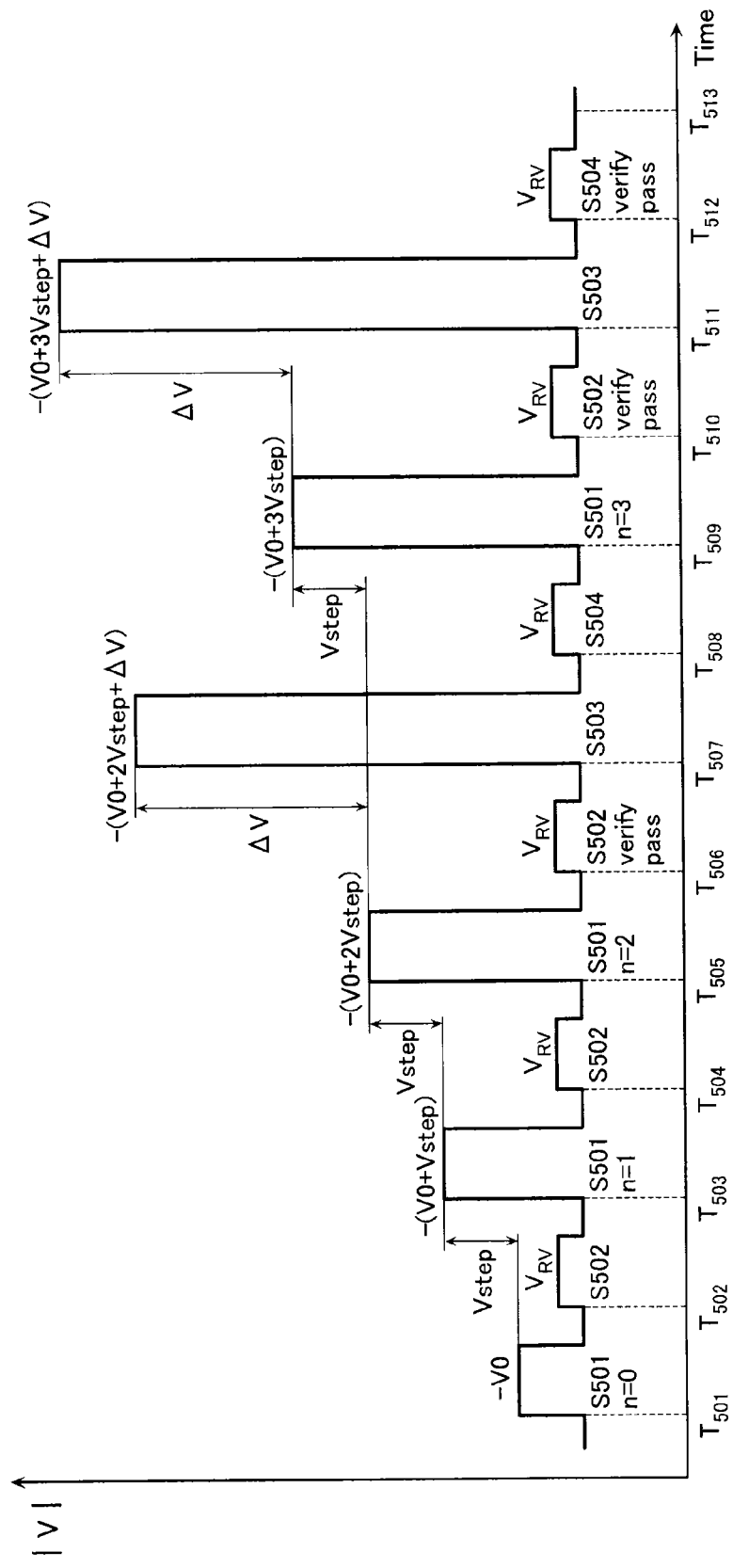
FIG. 29 is a timing diagram for illustrating the same reset operation.

FIG. 29 is a timing diagram showing the voltages (in absolute value) of a predetermined memory cell MC applied with the reset operation according to this embodiment.

At the timings $T_{501}$ to $T_{502}$, the first voltage application step S501 is performed. In this case, because of n=0, the memory cell MC is applied with −V0 as the first write voltage. Thus, as described with reference to FIG. 7B, the oxygen defects Vo in the defect region DR are decreased.

At the timings $T_{502}$ to $T_{503}$, the first verify step S502 is performed. Therefore, the memory cell MC is applied with the reset verify voltage $V_{RV}$. Here, in the example shown in FIG. 29, at the timings $T_{502}$ to $T_{503}$, the selected memory cell MC does not pass the first verify step S502.

At the timings $T_{503}$ to $T_{507}$, with n being incremented by one, the first voltage application step S501 and the first verify step S502 are repeatedly performed. Thus, as described with reference to FIG. 7B, the oxygen defects Vo in the defect region DR are decreased. Here, in the example shown in FIG. 29, at the timings $T_{506}$ to $T_{507}$, the selected memory cell MC passes the first verify step S502.

At the timings $T_{507}$ to $T_{508}$, the second voltage application step S503 is performed. In this case, because of n=2, the memory cell MC is applied with −V0−2Vstep−ΔV as the second write voltage. Thus, as described with reference to FIG. 7B, the oxygen defects Vo in the defect region DR are further decreased.

At the timings $T_{508}$ to $T_{509}$, the second verify step S504 is performed. Therefore, the memory cell MC is applied with the reset verify voltage $V_{RV}$. Here, in the example shown in FIG. 29, at the timings $T_{508}$ to $T_{509}$, the selected memory cell MC does not pass the second verify step S504.

At the timings $T_{509}$ to $T_{513}$, n is incremented by one, and further the first voltage application step S501, the first verify step S502, the second voltage application step S503, and the second verify step S504 are performed. Thus, as described with reference to FIG. 7B, the oxygen defects Vo in the defect region DR are further decreased. Here, in the example shown in FIG. 29, at the timings $T_{512}$ to $T_{513}$, the selected memory cell MC passes the second verify step S504. Therefore, the reset operation is ended here.

Figure 30:
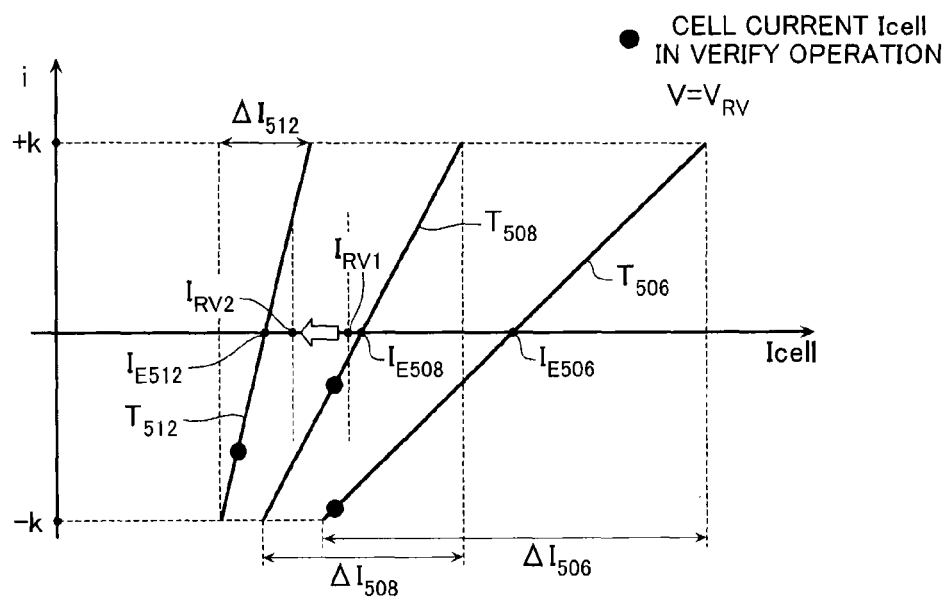
FIG. 30 is a graph for illustrating the same reset operation.

FIG. 30 is a graph showing the cell current Icell of a predetermined memory cell MC when the reset operation according to this embodiment is performed to the memory cell MC. In FIG. 30, the x-axis represents the cell current and the y-axis represents the above normalized current value i. In addition, the straight lines in FIG. 30 represent the distribution of the cell current Icell of the memory cell MC at the different timings $T_{506}$, $T_{508}$ and $T_{512}$. In addition, the closed circles in FIG. 30 represent the cell currents Icell acquired in the first verify step S502 or the second verify step S504 performed at the timings $T_{506}$, $T_{508}$ and $T_{512}$. Here, at the timings $T_{506}$, $T_{508}$ and $T_{512}$, the expectation currents are $I_{E506}/I_{E508}$ and $I_{E512}$ and the current variations are $\Delta I_{506}$, $\Delta I_{508}$ and $\Delta I_{512}$.

As shown in FIG. 28 and FIG. 29, in the reset operation according to this embodiment, the first voltage application step S501 and the first verify step S502 are repeatedly performed. Therefore, as shown in FIG. 30, at the timing $T_{506}$, the oxygen defects Vo in the variable resistance element VR are decreased to a degree that at least the cell current Icell under the application of the first verify voltage $V_{RV1}$ accidentally falls below the first threshold current $I_{RV1}$.

Here, as shown in FIG. 28 and FIG. 29, in the reset operation according to this embodiment, after the selected memory cell MC passes the first verify step S502, the second voltage application step S503 is further performed. In the second voltage application step S503, the selected memory cell MC is applied with the second write voltage. Therefore, as described with reference to FIG. 7B, the oxygen defects Vo may further be decreased in the defect region DR to stabilize the filaments. Thus, as shown in FIG. 30, at the timing $T_{508}$ when the second voltage application step S503 is ended, the expectation current is reduced to the $I_{E508}$ and the current variation is reduced to the $\Delta I_{508}$, thereby reducing the occurrence of the insufficient writing.

In addition, in the reset operation according to this embodiment, the second voltage application step S503 is performed to all memory cells MC. Therefore, the second voltage application step S503 may be performed without determining whether the step S503 is necessary or not. The reset operation can thus be performed relatively rapidly.

In addition, in the reset operation according to this embodiment, the second write voltage is larger than the first write voltage. Therefore, in the second voltage application step S503, the oxygen defects $V_O$ in the memory cell MC may suitably be decreased. Note, however, that, for example, the second write voltage may be set similar to the first write voltage ($\Delta V$ may be set to zero).

In addition, as shown in FIG. 28 and FIG. 29, in this embodiment, after the second voltage application step S503 is ended, the second verify step S504 is further performed. Here, as shown in FIG. 30, between the timing $T_{506}$ and the timing $T_{508}$, the second write step S503 decreases the current variation from $\Delta I_{506}$ to $\Delta I_{508}$. Therefore, it is considered that, in the second verify step S504, a current closer to the expectation current $I_{E508}$ is detected. In other words, it is considered that, in the second verify step S504, the state of the selected memory cell MC is detected more reliably than the first verify step S502. Therefore, by the method according to this embodiment, the probability in which the insufficient writing occurs is further reduced.

In addition, as shown in FIG. 30, in this embodiment, the second threshold current $I_{RV2}$ is set smaller than the first threshold current $I_{RV1}$. Here, as shown in FIG. 30, between the timing $T_{508}$ and the timing $T_{512}$, the expectation current decreases from $I_{E508}$ to $I_{E512}$. Here, in the second verify step S504, the state of the selected memory cell MC can be detected more reliably than the first verify step S502. Therefore, it is considered that the expectation current $I_{E512}$ at a timing when the second verify step S504 is passed is a value close to the second threshold current $I_{RV2}$. Therefore, by the method in this embodiment, adjustment to decrease the whole of the range of the current variation $\Delta I_{512}$ at the timing $T_{512}$ smaller than the first threshold current $I_{RV1}$ is performed. Therefore, the probability in which the insufficient writing occurs can be further reduced.

Note that although this embodiment performs the second verify step S504, the second verify step S504 may be omitted. In addition, for example, the degradation of the memory cell MC may be verified and if the degradation of the memory cell MC is not detected, then the second voltage application step S503 and the second verify step S504 may be omitted. Further, although in this embodiment, a reset operation in which the amount of the first write voltage is gradually increased is performed, a reset operation in which the first write voltage is set to a certain amount may be performed.

Sixth Embodiment

Figure 31:
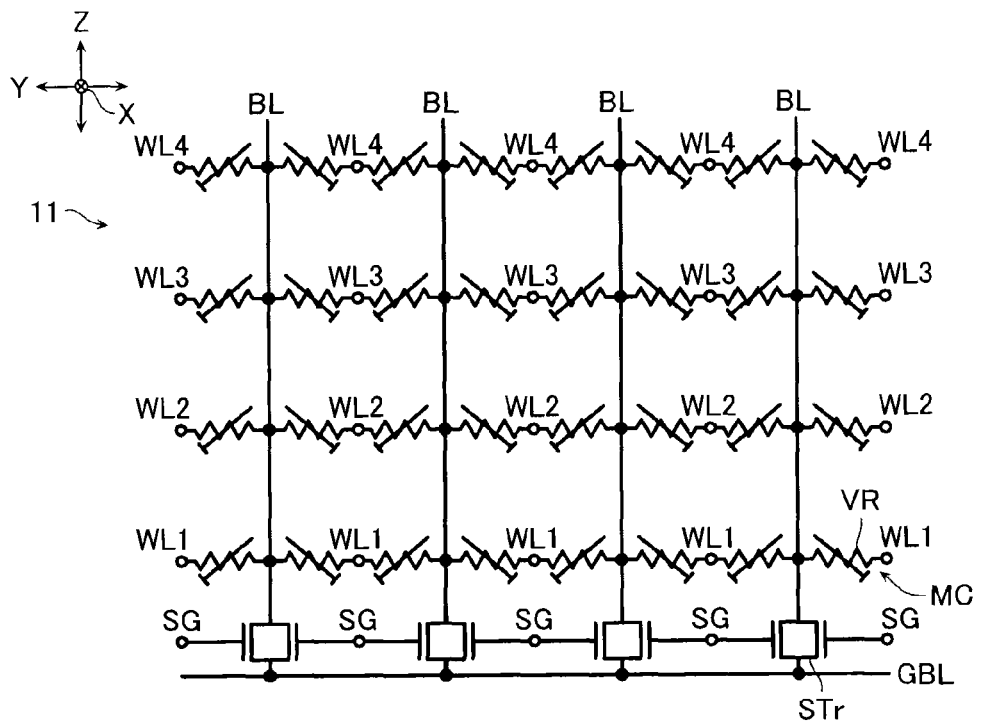
FIG. 31 is an example circuit diagram of a memory cell array 11 according to a sixth embodiment.
Figure 32:
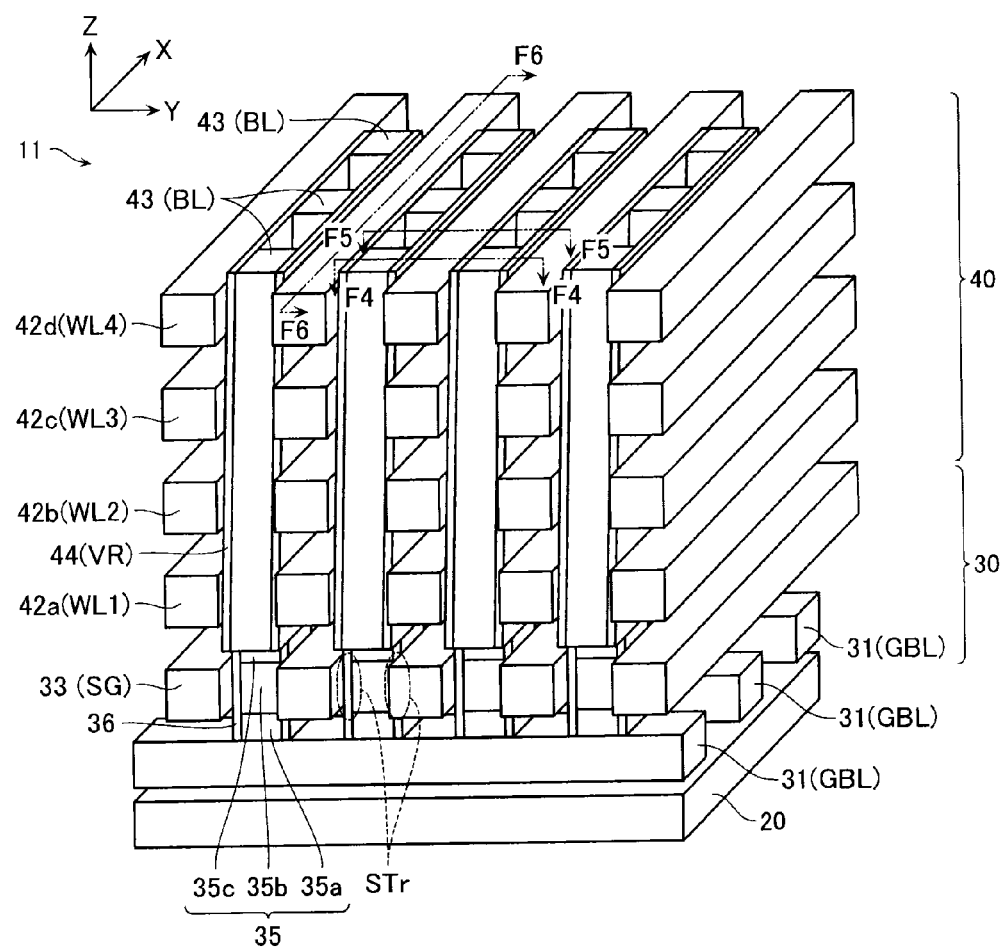
FIG. 32 is an example perspective view showing a stacked structure of the memory cell array 11.

Next, with reference to FIG. 31 and FIG. 32, a sixth embodiment will be described. FIG. 31 is an example circuit diagram of a memory cell array 11 according to this embodiment. FIG. 32 is an example perspective view showing a stacked structure of the memory cell array 11. Note that in FIG. 31 and FIG. 32, the X-direction, the Y-direction, and the Z-direction are perpendicular to each other, and the X-direction is a direction perpendicular to the plane of paper. In addition, a structure shown in FIG. 31 is provided repeatedly in the X-direction. In addition, in the following discussion, like elements as those in the first embodiment are designated with like reference numerals and their description is omitted here.

As shown in FIG. 31, the memory cell array 11 comprises, in addition to the above-mentioned word-lines WL, the bit-lines BL, and the memory cells MC, a plurality of select transistors STr, a plurality of global bit-lines GBL and a plurality of select gate lines SG.

As shown in FIG. 31 and FIG. 32, word-lines WL1 to WL4 are arranged in the Z-direction at a predetermined pitch and extend in the X-direction. The bit-lines BL are arranged in the X- and Y-directions in a matrix, and extend in the Z-direction. The memory cell MCs are disposed in the locations where the word-lines WL and the bit-lines BL are crossing. Therefore, the memory cells MC are arranged in the X-, Y-, and Z-directions in a three-dimensional matrix.

As shown in FIG. 31, each memory cell MC comprises a variable resistance element VR. As described with reference to FIG. 4, the variable resistance element VR comprises a metal oxide layer.

As shown in FIG. 31, each select transistor STr is provided between one end of one of the bit-lines BL and one of the global bit-lines GBL. The global bit-lines GBL are arranged in the X-direction at a predetermined pitch and extend in the Y-direction. One global bit-line GBL is commonly connected to one ends of the select transistors STr aligned in the Y-direction.

In addition, two select transistors STr adjacently arranged in the Y-direction have gate electrodes disposed therebetween and the gate electrodes may be commonly connected. The select gate lines SG are arranged in the Y-direction at a predetermined pitch and extend in the X-direction. One select gate line SG is commonly connected to the gates of the select transistors STr aligned in the X-direction. Note that the gate electrodes between the two select transistors STr adjacently arranged in the Y-direction may be separated and each of the two select transistors STr may be independently operated.

As described with reference to FIG. 10 to FIG. 12, the region in the metal oxide layer where the defect region DR is formed may differ depending on, for example, the distance of the memory cell MC from the row decoder 12 or the column decoder 13. Therefore, if the memory cell array 11 becomes large-scaled, the size difference of the defect regions DR may be increased between the memory cells MC. Here, recently, a type of memory cell array 11 in which the bit-lines BL extend in the Z-direction is becoming large-scaled. Therefore, a nonvolatile memory device comprising such a type of memory cell array 11 may comprise the control methods according to the first to fifth embodiments to suitably reduce the occurrence of the insufficient writing.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
   a memory cell comprising a variable resistance element connected between a couple of wirings; and
   a control circuit that applies a voltage between the couple of wirings connected to the memory cell,
   in data rewriting, the control circuit repeatedly performing a first voltage application step of applying a first write voltage between the couple of wirings connected to the memory cell and a first verify step of applying a first voltage lower than the first write voltage between the couple of wirings connected to the memory cell and comparing a cell current flowing through the memory cell with a first threshold current, the steps being repeatedly performed until a magnitude relation of the cell current and the first threshold current satisfies a first condition, and
   if the first condition is satisfied, the control circuit performing a second voltage application step of applying a second write voltage higher than the first write voltage between the couple of wirings connected to the memory cell.

2. The nonvolatile memory device according to claim 1, wherein
   the control circuit performs, after the second voltage application step is performed, a second verify step of applying a second voltage lower than the second write voltage between the couple of wirings connected to the memory cell and comparing the cell current with a second threshold current, and
   if a magnitude relation of the current flowing through the memory cell and the second threshold current does not satisfy a second condition, the control circuit repeatedly performs the second voltage application step and the second verify step until the second condition is satisfied.

3. The nonvolatile memory device according to claim 2, wherein
   the data rewriting is a set operation decreasing a resistance of the variable resistance element,
   the first condition is satisfied if the cell current exceeds the first threshold current,
   the second condition is satisfied if the cell current exceeds the second threshold current, and
   the second threshold current is larger than the first threshold current.

4. The nonvolatile memory device according to claim 2, wherein
   the data rewriting is a reset operation increasing a resistance of the variable resistance element,
   the first condition is satisfied if the cell current falls below the first threshold current,
   the second condition is satisfied if the cell current falls below the second threshold current, and
   the second threshold current is smaller than the first threshold current.

5. The nonvolatile memory device according to claim 1, wherein
   the control circuit repeatedly performs the first voltage application step and the first verify step with the amount of the first write voltage being gradually increased.

6. The nonvolatile memory device according to claim 1, wherein
   a plurality of the first wiring lines are arranged in a first direction perpendicular to a substrate at a predetermined pitch, the first wiring lines extending in a second direction parallel to the substrate, and
   a plurality of the second wiring lines are arranged in the second direction at a predetermined pitch, the second wiring lines extending in the first direction.

7. The nonvolatile memory device according to claim 1, further comprising an ECC circuit detecting a bit error of data read from the memory cell, wherein
   at least one of the control circuit and the ECC circuit counts an amount of the bit error detected by the ECC circuit, and
   in the data rewriting,
   the control circuit does not perform the second voltage application step if an amount of the bit error is equal to or smaller than a predetermined rate, and
   the control circuit performs the second voltage application step if the amount of the bit error is larger than the predetermined rate.

8. A method of controlling a nonvolatile memory device, the nonvolatile memory device comprising:
   a memory cell comprising a variable resistance element connected between a couple of wirings; and
   a control circuit that applies a voltage between the couple of wirings connected to the memory cell,
   the method comprising:
   performing repeatedly, a first voltage application step of applying a first write voltage between the couple of wirings connected to the memory cell and a first verify step of applying a first voltage lower than the first write voltage between the couple of wirings connected to the memory cell and comparing a cell current flowing through the memory cell with a first threshold current, until a magnitude relation of the cell current and the first threshold current satisfies a first condition; and performing, if the first condition is satisfied, a second voltage application step of applying a second write voltage higher than the first write voltage between the couple of wirings connected to the memory cell.

9. The method of controlling the nonvolatile memory device according to claim 8, wherein
after the second voltage application step is performed, a second verify step of applying a second voltage lower than the second write voltage between the couple of wirings connected to the memory cell and comparing the cell current with a second threshold current is performed, and
if a magnitude relation of the current flowing through the memory cell and the second threshold current does not satisfy a second condition, the second voltage application step and the second verify step are repeatedly performed until the second condition is satisfied.

10. The method of controlling the nonvolatile memory device according to claim 9, wherein
the data rewriting is a set operation decreasing a resistance of the variable resistance element,
the first condition is satisfied if the cell current exceeds the first threshold current,
the second condition is satisfied if the cell current exceeds the second threshold current, and
the second threshold current is larger than the first threshold current.

11. The method of controlling the nonvolatile memory device according to claim 9, wherein
the data rewriting is a reset operation increasing a resistance of the variable resistance element,
the first condition is satisfied if the cell current falls below the first threshold current,
the second condition is satisfied if the cell current falls below the second threshold current, and
the second threshold current is smaller than the first threshold current.

12. The method of controlling the nonvolatile memory device according to claim 8, wherein
the control circuit repeatedly performs the first voltage application step and the first verify step with the amount of the first write voltage being gradually increased.

13. The method of controlling the nonvolatile memory device according to claim 8, the nonvolatile memory device further comprising an ECC circuit detecting a bit error of data read from the memory cell, wherein
at least one of the control circuit and the ECC circuit counts an amount of the bit error detected by the ECC circuit, and
in the data rewriting,
the second voltage application step is not performed if an amount of the bit error is equal to or smaller than a predetermined rate, and
the second voltage application step is performed if the amount of the bit error is larger than the predetermined rate.

14. A nonvolatile memory device comprising:
a memory cell comprising a variable resistance element connected between a couple of wirings; and
a control circuit applying a voltage between the couple of wirings connected to the memory cell,
in data rewriting, the control circuit repeatedly performing a first voltage application step of applying a first write voltage between the couple of wirings connected to the memory cell and a first verify step of applying a first voltage lower than the first write voltage between the couple of wirings connected to the memory cell and comparing a cell current flowing through the memory cell with the first threshold current, the steps being repeatedly performed until a magnitude relation of the cell current and the first threshold current satisfies a first condition, and
if the first condition is satisfied, the control circuit performing a second voltage application step of applying a second write voltage between the couple of wirings connected to the memory cell.

15. The nonvolatile memory device according to claim 14, wherein
the control circuit performs, after the second voltage application step is performed, a second verify step of applying a second voltage lower than the second write voltage between the couple of wirings connected to the memory cell and comparing the cell current with a second threshold current, and
if a magnitude relation of the current flowing through the memory cell and the second threshold current does not satisfy a second condition, the control circuit repeatedly performs the second voltage application step and the second verify step until the second condition is satisfied.

16. The nonvolatile memory device according to claim 15, wherein
the data rewriting is a set operation decreasing a resistance of the variable resistance element,
the first condition is satisfied if the cell current exceeds the first threshold current,
the second condition is satisfied if the cell current exceeds the second threshold current, and
the second threshold current is larger than the first threshold current.

17. The nonvolatile memory device according to claim 15, wherein
the data rewriting is a reset operation increasing a resistance of the variable resistance element,
the first condition is satisfied if the cell current falls below the first threshold current,
the second condition is satisfied if the cell current falls below the second threshold current, and
the second threshold current is smaller than the first threshold current.

18. The nonvolatile memory device according to claim 14, wherein
the control circuit repeatedly performs the first voltage application step and the first verify step with the amount of the first write voltage being gradually increased.

19. The nonvolatile memory device according to claim 14, wherein
a plurality of the first wiring lines are arranged in a first direction perpendicular to a substrate at a predetermined pitch, the first wiring lines extending in a second direction parallel to the substrate, and
a plurality of the second wiring lines are arranged in the second direction at a predetermined pitch, the second wiring lines extending in the first direction.

20. The nonvolatile memory device according to claim 14, further comprising an ECC circuit detecting a bit error of data read from the memory cell, wherein
at least one of the control circuit and the ECC circuit counts an amount of the bit error detected by the ECC circuit, and
in the data rewriting,
the control circuit does not perform the second voltage application step if an amount of the bit error is equal to or smaller than a predetermined rate, and the control circuit performs the second voltage application step if the amount of the bit error is larger than a predetermined rate.

\* \* \* \* \*